(12) United States Patent
Shushakov et al.

(10) Patent No.: US 6,885,827 B2
(45) Date of Patent: Apr. 26, 2005

(54) HIGH SENSITIVITY, HIGH RESOLUTION DETECTION OF SIGNALS

(75) Inventors: Dmitry A. Shushakov, Moscow (RU); Vitaly E. Shubin, Moscow (RU)

(73) Assignee: Amplification Technologies, Inc., Brooklyn, NY (US)

(*) Notice: Subject to any disclaimer, the term of this patent is extended or adjusted under 35 U.S.C. 154(b) by 203 days.

(21) Appl. No.: 10/208,530

(22) Filed: Jul. 30, 2002

(65) Prior Publication Data

US 2004/0022538 A1 Feb. 5, 2004

(51) Int. Cl.[7] .............................................. H04B 10/06
(52) U.S. Cl. ...................................... 398/202; 398/210
(58) Field of Search ................................ 398/166, 202, 398/210; 250/265; 257/E31.075, E31.078

(56) References Cited

U.S. PATENT DOCUMENTS

| | | | |
|---|---|---|---|
| 3,806,772 A | 4/1974 | Early ........................... 330/35 |
| 4,040,077 A | 8/1977 | Tchon .......................... 357/24 |
| 4,194,888 A | 3/1980 | Schwab et al. ................... 55/2 |
| 4,311,908 A | 1/1982 | Goulianos et al. ........... 250/374 |
| 4,437,190 A | 3/1984 | Rozenwaig et al. ......... 455/600 |
| 4,486,765 A | 12/1984 | Capasso ...................... 357/13 |
| 4,535,233 A | 8/1985 | Abraham .................... 250/214 |
| 4,553,101 A | 11/1985 | Mathis ........................ 329/50 |
| 4,730,128 A | 3/1988 | Seki ........................... 307/310 |
| 4,794,257 A | 12/1988 | Baba et al. .................. 250/370 |
| 4,885,620 A | 12/1989 | Kemmer et al. .............. 357/24 |
| 4,896,200 A | 1/1990 | Seki et al. .................... 357/30 |
| 4,956,716 A | 9/1990 | Hewitt et al. ............... 358/212 |
| 4,973,913 A | 11/1990 | Oda ............................ 328/117 |
| 5,026,148 A | 6/1991 | Wen et al. ................... 350/386 |
| 5,138,476 A | 8/1992 | Shibutani .................... 359/191 |
| 5,144,122 A | 9/1992 | Danley et al. ............ 250/201.2 |
| 5,146,296 A | 9/1992 | Huth ............................ 357/19 |
| 5,162,658 A | 11/1992 | Turner et al. ................ 250/554 |
| 5,164,809 A | 11/1992 | Street et al. ................... 257/55 |
| 5,198,673 A | 3/1993 | Rougeot et al. ......... 250/370.11 |
| 5,245,191 A | 9/1993 | Barber et al. ........... 250/363.04 |
| 5,281,821 A | 1/1994 | Antich et al. ................ 250/368 |
| 5,334,839 A | 8/1994 | Anderson et al. ........... 250/368 |
| 5,347,132 A | * 9/1994 | Holzman et al. ........... 250/389 |
| 5,844,598 A | 12/1998 | Janesick ....................... 348/79 |
| 5,880,490 A | * 3/1999 | Antich et al. ............... 257/186 |
| 6,243,178 B1 | 6/2001 | Suemura et al. ............. 359/128 |

FOREIGN PATENT DOCUMENTS

| | | | |
|---|---|---|---|
| GB | 1197593 A | * 7/1970 | ............ H01I/11/06 |
| SU | 1702831 A1 | 6/1997 | |

OTHER PUBLICATIONS

PCT International Search Report dated Jan. 12, 2004 in counterpart International Application No. PCT/US3/23450.
English Language Abstract of SU1702831A1, Derwent World Patents Index, Dialog File No. 351, Accession No. 1171712304.

(Continued)

Primary Examiner—Jason Chan
Assistant Examiner—Christina Y Leung
(74) Attorney, Agent, or Firm—Morgan & Finnegan, LLP

(57) ABSTRACT

A system and method providing for the detection of an input signal by distributing the input signal into independent signal components that are independently amplified. Detection of an input signal comprises generating from the input signal a plurality of spatially separate elementary charge components, each having a respective known number of elementary charges, the number of the plurality of spatially separate elementary charge components being a known monotonic function of the magnitude of said input signal; and independently amplifying each of the plurality of spatially divided elementary charge components to provide a respective plurality of signal charge packets, each signal charge packet having a second number of elementary charges greater than the respective known number by a respective amplification factor.

119 Claims, 13 Drawing Sheets

OTHER PUBLICATIONS

Rochas et al. "A Geiger Mode Avalanche Photodiode Fabricated in a Conventional CMOS Technology", *Proceedings of ESSDERC 2001*, Sep. 11–13, 2001, pp. 483–486.

Bisello et al., Silicon Avalanche Detectors with Negative Feedback as Detectors for High Energy Physics, *Nuclear Instruments & Methods in Physics Research A*, vol. 367, pp. 212–214, Dec. 1995.

Kulkarni et al., "New Approaches in Medical Imaging Using Plastic Scintillating Detectors," *Nuclear Instruments & Methods in Physics Research*, H.H. Andersen et al., vol. B79, pp. 921–925, 1993.

Antich et al., "Avalanche Photo Diode with Local Negative Feedback Sensitive to UV, Blue and Green Light", *Nuclear Instruments & Methods in Physics Research A*, vol. 389, No. 3, pp. 491–498, Apr. 1997.

Bisello et al., "Metal–Resistive Layer–Silicon (MRS) Avalanche Detectors With Negative Feedback" *Nuclear Instruments & Methods in Physics Research A*, vol. 360, pp. 83–86, Jun. 1995.

Bisello et al., "Electrical Characteristics of Metal–Resistive Layer–Silicon (MRS) Avalanche Detectors" Proceedings of ICATPP–4 (Oct. 3–7, 1994), *Nuclear Physics B* (Proc. Suppl.) 44 (1995), pp. 397–401.

Sadyigor et al., "The Investigation of Possibility to Create the Multichannel Photodetector Based on the Avalanche MRS– Structure", *Optical Memory and Neural Networks*, A.L. Mikaelian, Editor, Proc. SPIE 1621, pp. 158–168 (1991).

Vasile et al., "High Gain Avalanche Photodiode Arrays for DIRC Applications", *1988 IEEE Nuclear Science Symposium Conference Record, IEEE Transactions on Nuclear Science*, vol. 46, No. 4, pp. 848–852, Aug. 1999.

Shushakov et al., "New Solid State Photomultiplier," *Optoelectronic Integrated Circuit, Materials, Physics and Devices Conference* (Part of Photonics West 95 Symposium, Feb. 11, 1995), Proc. SPIE 2397, pp. 544–554 (1995).

Locker et al., "A New Ionizing Radiation Detection Concept Which Employs Semiconductor Avalanche Amplification And The Tunnel Diode Element," *Applied Physics Letters*, vol. 9, No. 6, pp. 227–230 (Sep. 15, 1966).

Lou et al., "A Charge Accumulation and Multiplication Photodector," *Photodetectors and Power Meters*, Proc. SPIE 2022, pp. 121–131 (1993).

Lou et al., "An Experimental Study of a Metal– Oxide— Semiconductor Photomultiplier," *Journal of Applied Physics*, vol. 66, No. 6, pp. 2678–2688, Sep. 15, 1989.

Afanasiev et al., "MRS Silicon Avalanche Detectors with Negative Feedback for Time–of–Flight Systems", Proceedings of ICATPP–4 (Oct. 3–7, 1994), *Nuclear Physics B* (Proc. Suppl.) 44 (1995), pp. 402–405, Nov. 1995.

* cited by examiner

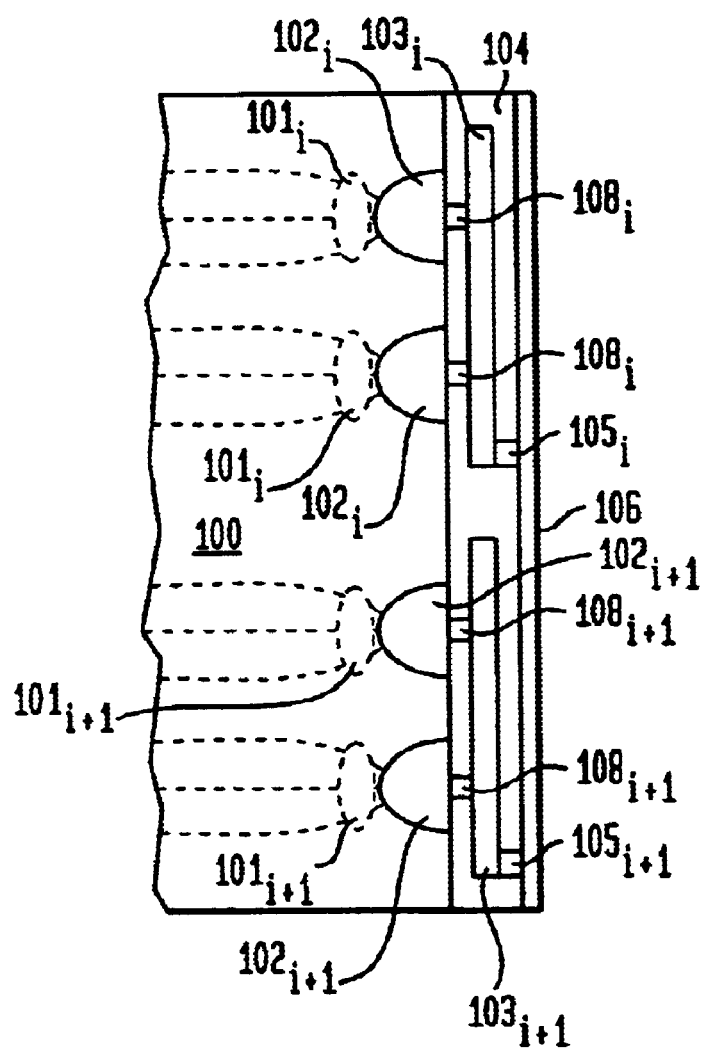

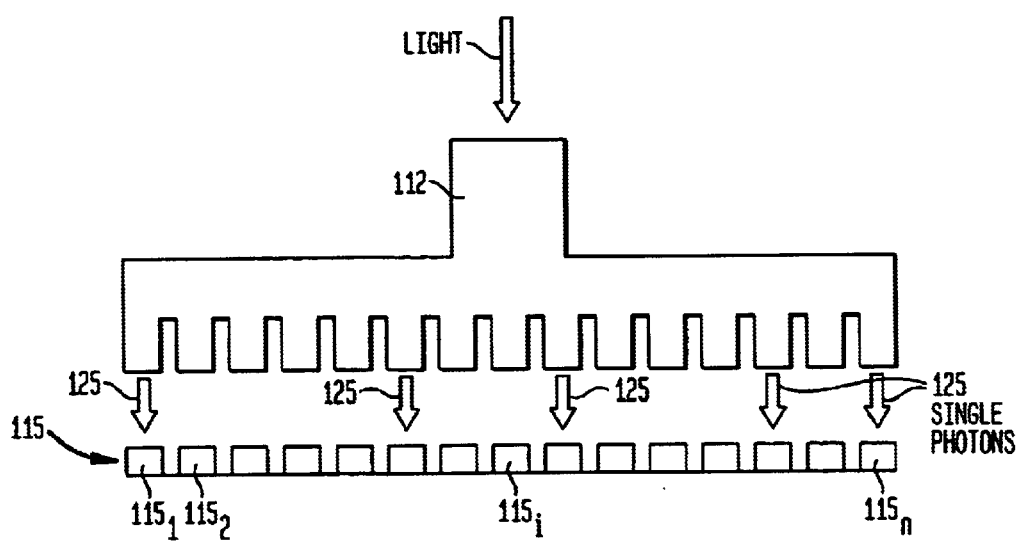

HIGH SENSITIVITY, HIGH RESOLUTION DETECTION OF SIGNALS

TECHNICAL FIELD

The present invention relates generally to signal detection and, more particularly, to detecting a weak or low level signal, such as a weak optical or electrical signal, and preferably to detecting such a weak signal with high resolution of the signal magnitude.

BACKGROUND OF THE INVENTION

Recording and measuring a weak signal represented by, for example, one to several dozen elementary charge carriers presents challenging and acute problems for the designers of modern sensors and transducers for myriad applications in diverse fields of science and technology. In these sensors and transducers, various primary signals (optical, ultrasonic, mechanical, chemical, radiation, etc.) are transformed into elementary charge carriers, such as electrons, holes, or ions, depending on the specific types and versions of the devices being developed for this purpose. Signal charge packets of such elementary charge carriers are amplified and converted to a signal (e.g., to a voltage signal) that is fed into a recording or analyzing device itself and/or as a feedback signal into a controller of the mechanisms or processes that are monitored with the sensors or transducers.

In many applications, such as those relating to laser information and metering devices, recording and image transfer systems, and radiation or particle detecting systems in the physics and nuclear engineering fields, high-speed sensor devices with critical threshold parameters are in an acute demand. Such applications demand sensors capable of detecting and recording of electrical signals that are not only weak (e.g., as few as one or several elementary charge carriers), but also short in duration and/or rapidly varying (i.e., have a large bandwidth). Accordingly, these applications require a sensor capable of amplifying such electrical signals over a wide bandwidth and with a low noise level. It is well known that the first stage of signal amplification primarily determines the basic parameters and characteristics of the sensor device, such as its threshold sensitivity, signal resolution, and response speed (e.g., bandwidth), and presently, generally two paradigms or approaches are being followed in developing sensors having signal amplification characteristics suited for detecting and recording weak electrical signals.

One widespread approach consists in "perfecting" or optimizing traditional analog amplifiers, in which all sets of the input charge carriers are amplified simultaneously. Noise reduction with simultaneous improvement of the threshold sensitivity is achieved primarily by decreasing the geometric size of the amplifier stage of the device. By applying such a scaling approach to charge-coupled device (CCD) video amplifiers, for example, it is possible to attain a threshold sensitivity of several dozen electrons. Such a scaling approach, however, does not solve the problem of recording signals consisting of several electrons.

Another approach to sensing weak electrical signals is using avalanche amplification (multiplication) of signal carriers, which generally is the most sensitive and high-speed method of amplification known in the art. As is well known, avalanche amplification is based on impact ionization arising in a strong electric field, wherein the signal carriers accelerating in an electric field ionize the atoms of the working medium of the amplifier, thus resulting in multiplication (e.g., duplication) of the signal carriers. At a high multiplication factor, however, it is difficult to stabilize the avalanche amplification operating point. Additionally, the internal (excessive) noise level and the response time grow rapidly with increasing multiplication factor. Due to these problems associated with using a large multiplication factor, traditional avalanche photodiodes use a rather low multiplication factor, M, typically less than $10^3$, that does not allow for detecting and recording signals consisting of several electrons in a wide band.

Avalanche multiplication has also been applied to recording individual ionizing particles using a Geiger-Muller counter. A particle entering such a device initiates an avalanche-like process of multiplication of the signal carriers up to a necessary recording level. More recently, this principle has been successfully used for recording single charge carriers in semiconductor avalanche-type photodiodes. This Geiger-Muller principle of amplification, however, does not allow for distinguishing between signals of one and several input charge carriers (i.e., it does not provide high resolution of the number of charge carriers).

It may be appreciated, therefore, that there remains a need for further advancements and improvements in detecting weak signals, and particularly in providing a system and method for high sensitivity and high resolution detection of signals, as well as for such high resolution detection of weak signals with a high bandwidth.

SUMMARY OF THE INVENTION

The present invention provides such advancements and overcomes the above mentioned problems and other limitations of the background and prior art, by providing a system and method providing for the detection of an input signal by distributing the input signal into independent signal components that are independently amplified. In accordance with an aspect of the present invention, a system and method providing for the detection of an input signal comprises generating from the input signal a plurality of spatially separate elementary charge components, each having a respective known number of elementary charges, the number of the plurality of spatially separate elementary charge components being a known monotonic function of the magnitude of said input signal; and independently amplifying each of the plurality of spatially divided elementary charge components to provide a respective plurality of signal charge packets, each signal charge packet having a second number of elementary charges greater than the respective known number by a respective amplification factor.

In accordance with another aspect of the invention, the number of the plurality of spatially separate elementary charge components is proportional to the magnitude of said input signal. Also, each of the plurality of signal charge packets has a sufficient second number of elementary charges to provide for detection thereof.

In accordance with yet another aspect of the invention, the independent amplification of the plurality of spatially divided elementary charge components provides each of said plurality of signal charge packets with substantially the same said second number of elementary charges.

In accordance with still another aspect of the invention, the plurality of spatially separate elementary charge components each have substantially a same first number of elementary charges, the respective known numbers thereby each being substantially equal to said first number. This first number may be substantially equal to one to within a statistically significant metric.

In accordance with the present invention, the input signal may be optical or electrical. If the input signal is an optical signal, the spatially separate elementary charge components may be provided by splitting the optical signal into a plurality of photon signal packets. If the input signal is an electrical signal, the spatially divided elementary charge components are provided by splitting the electrical signal into each of the spatially divided elementary charge components.

In accordance with a further aspect of the present invention, the independent amplification of each of the plurality of spatially divided elementary charge components is provided by avalanche multiplication, and this may include multi-stage avalanche multiplication.

BRIEF DESCRIPTION OF THE DRAWINGS

Additional aspects, features, and advantages of the invention will be understood and will become more readily apparent when the invention is considered in the light of the following description made in conjunction with the accompanying drawings, wherein:

FIG. 3 depicts shown a schematic cross-sectional view of a portion of a discrete amplifier implemented as a semiconductor device, in accordance with an illustrative embodiment of the present invention;

FIG. 12 illustrates an embodiment of an optical splitter made as a fiber-optic linear array dividing the light signal, projected on the narrow input part of the splitter onto the separate channels of the storage area associated with electrodes of a charge coupled splitter, in accordance with the embodiment of the invention depicted in FIGS. 11A and 11B.

DETAILED DESCRIPTION OF THE INVENTION

Figure 1:
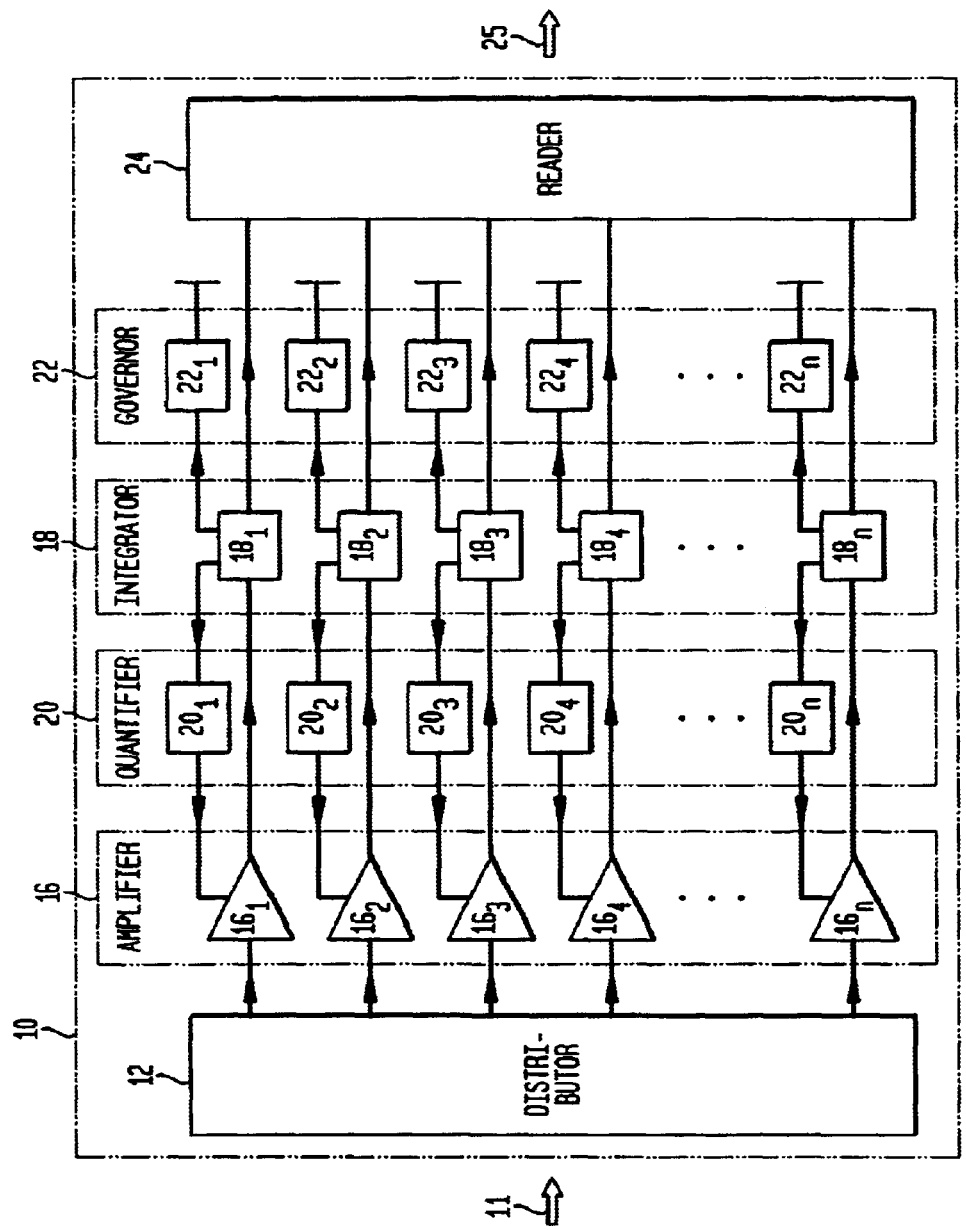
FIG. 1 shows an illustrative functional block diagram of a discrete amplifier in accordance with an embodiment of the present invention.

FIG. 1 shows an illustrative functional block diagram of a discrete amplifier 10 in accordance with an embodiment of the present invention. As depicted, discrete amplifier 10 is a multichannel amplifier, with each channel (referenced by subscript i, i=1, 2, 3, 4 . . . n) comprising an amplifier $16_i$ responsive to a quantifier $20_i$ and coupled to an integrator $18_i$, which is coupled to quantifier $20_i$ and to governor $22_i$. A distributor 12 is responsive to an input signal 11 and provides an output coupled to the input of each channel amplifier $16_i$. A reader 24 is coupled to each integrator 18 and provides an amplified output signal 25 representative of input signal 11. Thus, discrete amplifier 10 may be viewed as a multichannel amplifier having a distributor 12 coupled to an amplifier stage 16, which is responsive to a quantifier stage 20 and is coupled to an integrator stage 18, which in turn is coupled to quantifier stage 20, governor stage 22 and reader 24. As will be further understood, the lines/arrows schematically depicted as interconnecting functional components indicate a functional coupling or relationship, and do not necessarily indicate that the interconnected functional components, or structural components corresponding to the functional components, are conductively coupled or directly connected structurally. Additionally, discrete amplifier 10 may be implemented in various technologies; for example, it may be a solid state, semiconductor, or vacuum device, depending on the application.

Input signal 11 may be any optical or electrical signal of interest, and may directly or indirectly represent a primary signal of interest. More specifically, for example, input signal 11 may be the primary optical or electrical signal to be measured or may be the output of a sensor that transduces, converts or transforms a primary signal (e.g., an acoustic, pressure, or other mechanical signal; an uncharged particle/species; a charged particle/species or other electrical signal; a magnetic signal; an optical or other electromagnetic signal (e.g., x-ray)). Accordingly, an input signal, as used herein, is not limited to any particular application or sensor, but is an optical or electrical signal that directly or indirectly represents any signal or particle/species to be detected or measured.

Distributor 12 spatially distributes (e.g., splits, divides, spreads out, or couples) input signal 11 into a number of independent signal components (photon or charge components) of known respective magnitudes (e.g., substantially equal magnitudes) that excite or stimulate independent amplifying channels. The illustration in FIG. 1 of distributor 12 being coupled to each of the n amplifier channels input schematically depicts that the distributor is capable of providing a signal component to the input of each channel; however, under intended operating conditions, all amplifier channel inputs do not invariably receive such a signal component. Instead, the number of amplifier channel inputs that receive a signal component varies with the magnitude of input signal 11. More specifically, the known respective magnitudes (e.g., substantially equal magnitudes) of the signal components (the "size" of each of the signal components) generated by distributor 12 is substantially independent of the input signal 11 magnitude, and concomitantly, the number of signal components (and hence the number of excited or stimulated independent amplifying channels) represents the input signal magnitude. In an embodiment of the invention, the signal component magnitude corresponds to one fundamental unit (e.g., one photon or one electronic charge species) of the input signal 11, although in alternative implementations the signal component magnitude can be established to correspond to a multiple of the fundamental unit of the input signal. Additionally, distributor 12 may be designed such that the magnitude of each signal component itself can be one unit (e.g., one photon or one electronic charge species) or more than one unit, provided it is substantially independent of the input signal 11 magnitude. While the present invention may be practiced by having distributor 12 provide any known sized output signal components (but not necessarily equal nor necessarily unit sized), for ease and clarity of exposition the ensuing description is set forth according to illustrative implementations having distributor 12 provide equal sized output signal components typically of one fundamental unit in size (e.g., one photon or one electron per output channel of the distributor).

In accordance with the present invention, such distribution of the input signal 11 may be provided in the optical and/or electrical domain. If the input signal is an optical signal, then an optical splitter may be implemented with a sufficient number of output channels such that the input signal is divided into a number of spatially independent photon packets and each packet is assured (e.g., within a statistical metric) of having substantially the same number of photons. These photon packets may be provided as the respective signal components output by distributor 12, incident onto the corresponding inputs of amplifier stage 16 to generate a corresponding electrical charge that is amplified therein. Alternatively, within distributor 12 these photon packets may be converted to substantially equal magnitude electrical charge packets, which undergo splitting in the charge domain into electrical signal components that are coupled to corresponding inputs of amplifier stage 16. In another embodiment, an optical input signal 11 may be converted first in its entirety into an electrical signal, which is then split in the charge domain into electrical signal components that are coupled to corresponding inputs of amplifier stage 16. For an electrical (e.g., charge) input signal 11, distributor 12 may split the input signal in the electrical (e.g., charge) domain to provide substantially equal sized charge packets (their size independent of the input signal magnitude) as the electrical signal components that are coupled to corresponding inputs of amplifier stage 16. As may be appreciated, splitting an optical signal into photon packets may be implemented in one optical splitting stage or in a series of optical splitting stages. Similarly, splitting any electrical signal (or charge packets) into charge packets (or smaller charge packets) may be implemented in one or a series of charge splitting stages. Typically, however, splitting in a single stage is advantageous with respect to speed and/or efficiency or signal loss (e.g., losses due to charge transfer inefficiency in a CCD splitter).

The number n of channels over which distributor 12 is capable of providing a signal component is selected based on the dynamic range of the input signal 11 to be sensed. The desired resolution or discrimination (or quantization error) of the input signal is another parameter affecting the distributor 12 design. For example, assuming that it is desired to detect over an acquisition period an input signal 11 having from 1 to 100 photons, with a resolution of one photon, then distributor 12 (and, generally, discrete amplifier 10) should be designed with a sufficient number of channels n to ensure within a statistical metric that the maximum input signal (i.e., 100 photons) is split into independent photon packets that each contain only one photon. By way of example, if the desired resolution (i.e., discrimination of the input signal magnitude) were to within about 2 photons, then, similarly, distributor 12 should be designed with a sufficient number of channels n to ensure within a statistical metric that the maximum input signal (i.e., 100 photons) is split into independent photon packets that each contain two photons.

Accordingly, by operation of distributor 12, an input signal is directly distributed (i.e., distributed prior to any physical conversion or transformation; e.g., an optical input signal split into independent photon packets, or an electrical input signal split into independent charge packets) or indirectly distributed (i.e., distributed after a physical conversion or transformation; e.g., an optical input signal converted to an electrical signal that is split into independent charge packets) or both directly and indirectly distributed (e.g., an optical input signal distributed into spatially separate and substantially equal sized photon packets, which are converted into respective electrical signal packets that are each further distributed into independent and substantially equal sized charge packets) among a number of independent amplifying channels to ensure, within some designed or determinable statistical tolerance or metric, that a substantially equal number (e.g. one) of signal components (e.g., a charge component or a photon component) are input to each independent amplifying channel. In this way, the number of stimulated amplifier channels $16_i$ is a monotonic function (e.g., proportional, and including any smooth or step-like monotonic function) of the input signal magnitude; hence, as further explained below, the input signal may be quantified or measured according to the number of amplifier channel outputs that provide an amplified signal indicating that the amplifier channel was excited or stimulated by a distributed component of the input signal.

It is appreciated, therefore, that such distribution of the input signal would not be achieved, for example, by conventional imaging with a one or two-dimensional detector array (e.g, a CMOS active pixel sensor) because such a conventional imaging device does not distribute the image over the pixels in a manner that ensures, for an arbitrary image signal, that substantially the same number of photons impinge on each excited pixel over a given acquisition or integration time (e.g., that the average or nominal photon flux of a stimulated pixel is substantially independent of the input signal magnitude as well as time; the number of stimulated pixels is a monotonic function of the input signal magnitude). More specifically, in such an imaging array example, wherein to provide for two-dimensional imaging each array element receives a photon flux corresponding to the image intensity in the region of that element, there is no mechanism or operation that uniformly distributes the overall image intensity over the array elements in components having a common magnitude that is independent of the overall image intensity. While it is hypothetically possible that for random or arbitrary time intervals an image might excite a number of array elements with approximately the same number of photons while not exciting any other array elements, and the number of such excited array elements may vary or fluctuate, a conventional imaging array and methodology for detecting such an image nevertheless does not distribute the image inasmuch as it does not include any mechanism or operation to ensure such distribution within a statistically significant metric.

In accordance with an embodiment of the present invention, each amplifier $16_i$ has two states, referred to for convenience as ON and OFF, that are established or controlled based on the output voltage of quantifier $20_i$. According to a feature of an embodiment of the invention, the two-state operation of amplifier $16_i$ under control from quantifier $20_i$ together with the operation of integrator $18_i$ ensures that the magnitude of the signal coupled to reader 24 from a stimulated channel is (1) essentially independent of fluctuations in the size of the signal component input to the amplifier $16_i$ of that channel and (2) substantially the same magnitude as for all other stimulated channels. In the ON state, amplifier $16_i$ waits for any signal component coupled to its input from distributor 12, the appearance of such a signal at its input initiating or stimulating amplifier $16_i$ with a given probability $P_{amp}$ to commence amplifying the input signal component. This amplification process is stopped only after amplifier $16_i$ switches to the OFF state in response to the output voltage of quantifier $20_i$. Accordingly, amplifier $16_i$ may be characterized by $P_{amp}$ and by two voltages Uon and Uoff that correspond to the quantifier output voltage that causes amplifier $16_i$ to switch ON and OFF, respectively. As further described below, amplifier $16_i$ may be an avalanche multiplication amplifier (e.g., an avalanche diode), which advantageously may be implemented as a threshold amplifier employing self-limited gain. Also, as may be appreciated, since depending on the implementation, the signal components output by distributor 12 may either be charge components or photon components, amplifier $16_i$ is appropriately designed for efficient coupling of the signal component. For example, if the signal component output by the distributor is optical, then amplifier $16_i$ will advantageously include or be integrated with a photon absorption/photoconversion region to efficiently absorb the incident photon packet and generate a corresponding charge signal that is amplified.

For clarity, it is noted that photoconversion of photon signal components (i.e. components that are not further distributed/split) is a function separate from the distributor function and amplifier function and is generally implemented as an element distinct from the distributor and amplifier. Since, however, in practice the photoconversion element typically may be integrated with the distributor element and/or amplifier element, for convenience and ease of description the photoconversion element may be considered as embodied within the amplifier or the distributor, and has herein been considered integrated with the amplifier (i.e., within the functional block for the amplifier) to highlight the distributing (splitting) function of the distributor. If the photoconversion element were considered as integrated with the distributor, then in the event that the input signal were optical the distributor functional block would only output charge signal components (i.e., as opposed to either charge or photon signal components), and concomitantly amplifier $16_i$ would not be considered as having photoconversion integrated therewith. Again, associating photoconversion of photon signal components with the distributor or amplifier is arbitrary and for convenience, as photoconversion of signal components is not a necessary function of, and is generally functionally and structurally distinct from, the distributor and amplifier, even when a photoconversion element is integrated therewith.

As described, quantifier $20_i$ is an element operative in controlling the state of amplifier $16_i$ in accordance with the voltage established on the integrator. It may therefore be characterized by a voltage transfer factor $k_q = U_{quantifier\_output}/U_{quantifier\_input}$, i.e., the ratio of the quantifier output voltage (i.e., $U_{quantifier\_output}$) to the quantifier input voltage (i.e., $U_{quantifier\_input}$), the latter voltage being a function of the integrator 18 potential. The voltage transfer factor is of appropriate polarity to ensure proper switching of amplifier $16_i$. In a typical implementation, for example, as the amplification process proceeds, the increasing charge generated by amplifier $16_i$ is coupled to the integrator 18 to cause its output voltage (and hence Uquantifier_input) to increase; thus, assuming a negative or low voltage is required to turn off amplifier $16_i$, $U_{quantifier\_output}$ should decrease with increasing $U_{quantifier\_input}$.

The charge generated by amplifier $16_i$ is coupled to integrator $18_i$, causing the integrator $18_i$ output voltage Uint to increase as the generated charge increases. In the illustrative embodiment, this coupling is capacitive, via a capacitance Cint associated with integrator $18_i$, and as amplifier $16_i$ generates charge through the amplification process, charge Qacc accumulates via capacitive coupling such that Uint= Qacc/Cint. This voltage Uint is coupled or applied simultaneously to both quantifier $20_i$ and governor $22_i$ inputs. At the same time, in accordance with an embodiment of the present invention, charge Qacc accumulated in integrator $18_i$ induces generation of the same amount of charge in Reader 24.(e.g., via a capacitance Cint).

Governor 22 eliminates the accumulated charge Qacc from integrator $18_i$ after integrator $18_i$ achieves an output voltage Uint sufficient to cause amplifier $16_i$ to switch OFF via quantifier $20_i$. In a simple implementation considered in the illustrative embodiment of FIG. 1, governor 22 eliminates the accumulated charge Qacc by conducting it to ground. In an alternative embodiment, governor 22 may eliminate the accumulated charge by transferring it to reader 24 to, for example, contribute to the generation of output signal 25. Governor 22 may be implemented as having two modes: an open (non-blocking) mode characterized by a resistance Rop, and a closed (blocking) mode characterized by a resistance Rcl, wherein Rcl>>Rop. In accordance with the illustrative embodiment, governor 22 may be characterized by a threshold voltage Ur_on such that upon a voltage input to governor 22 (e.g., coupled from integrator $18_i$) reaching or exceeding threshold voltage Ur_on, governor 22 opens (i.e., switches to the open mode) with some delay, and upon the voltage input to governor 22 becoming lower than threshold voltage Ur_on, governor 22 switches to the close mode. The delay time ($\tau_r$) in switching to the open mode after achieving the appropriate threshold Ur_on typically should be greater than the greatest possible time for charge accumulation in integrator $18_i$. Also, the threshold voltage Ur_on preferably is rather low to provide for nearly full elimination of charge accumulated in the integrator before entering the closed mode.

A reader 24 is coupled to each integrator $18_i$ and provides an amplified output signal 25 representative of input signal 11 based on the number of amplifier channels that provide an output signal (and thus have been stimulated by distributor 12). More specifically, since the number of excited amplifier channels, and thus the number of integrators having accumulated charge packets, corresponds to the input signal, reader 24 is operative in reading the accumulated charge packets to provide an output signal that is a measure of the input signal. It is noted that in an advantageous implementation, where the number of signal components generated by distributor 12 equals the number of elementary units (i.e., photons or charge units) in the input signals, then the number of accumulated charge packets equals the number of elementary units in the input signal, and thus accurate readout of the number of integrated charge packets corresponding to the amplified signal components provides for resolution of single elementary units of the input signal.

Reader 24 may be implemented to function in a "discrete" mode or in an "analog" mode. More specifically, in a "discrete" mode, reader 24 essentially individually counts, by individually sensing, the amplification channels that provide output charge packets. In an "analog" mode, instead of individually counting or sensing the accumulated charge packets, reader 24 essentially combines (e.g, sums) the individual accumulated charge packets to form a combined charge packet that is measured or sensed (e.g, by conversion to a current or voltage signal).

For a "discrete" mode readout, reader 24 may be implemented, for example, as a multiplexer circuit that individually and sequentially selects each amplifier channel output to provide individual output signals (e.g., pulses) that are subsequently processed (e.g., counted). As another example, each amplifier channel output may be coupled to a separate comparator (e.g., charge comparator), and a decoder or summing circuit receives the outputs from all the comparators to generate an output signal proportional to the number of accumulated charges. As yet a further example, reader 24 may be iimplemented as a CCD shift register to readout the accumulated charge packets (e.g., the accumulated charge packets may be in parallel dumped directly into separate CCD potential wells, or may be used in parallel to generate corresponding charge packets in separate CCD potential wells). As may be appreciated, a feature of individually sensing the accumulated charge packets is that this approach is not sensitive to variations in the magnitude of the amplified charge packet, provided that the amplifying channels provide sufficient amplification to detect each accumulated charge packets.

To effect an "analog" readout, reader 24 may be implemented, for example, as a capacitance coupled capacitively with each integrator $18_i$ such that charging of a given integrator $18_i$ induces charging of equal magnitude in the reader 24 output capacitance and all the induced charges corresponding to the integrators are additive, thus providing a combined charge packet. The magnitude of the combined charge packet (and hence the magnitude of the corresponding current or voltage signal) is proportional to the number of accumulated charge packets, and thus, to the number of elementary or fundamental units (i.e., charges or photons) in the input signal. It is appreciated, however, that in such an analog readout implementation wherein, for example, reader 24 sums the outputs of each channel, preferably the charge induced in reader 24 by each excited channel is substantially the same to provide for high sensitivity and high resolution detection of the input signal. That is, the amplification noise is preferably reduced to a minimum level required for detecting the number of fundamental units (charges or photons) in the input signal (preferably with single charge/photon resolution), by means of equalization of the charge packets.

For this purpose, the formation of each accumulated charge packet that contributes to the combined charge packet is carried out by dosed accumulation of a given amount (dose) of elementary charges in this packet by operation of integrator $18_i$ together with quantifier $20_i$. These components cooperate to terminate the amplification process in amplifier $16_i$ upon generating a given amount (dose) of elementary charges in the charge packets accumulated by integrator $18_i$. Alternatively, or in addition (e.g, if the amplification process cannot be terminated as rapidly and/or as accurately as desired for equalization), such dosed accumulation may be effected by eliminating any excessive charge (i.e., charge exceeding the desired dose) generated by the amplifier. Such elimination may be effected upon accumulating the desired dose to avoid accumulation of any charge beyond the desired dose (e.g, by providing shunting excess charge upon accumulating the desired dose), or may be effected after accumulating charge in excess of the desired dose.

The operation of the discrete amplifier embodiment of FIG. 1 is now described with reference to FIGS. 2A–2E, which for clarity of exposition depicts functional components of only two channels of the discrete amplifier.

Figure 2A:
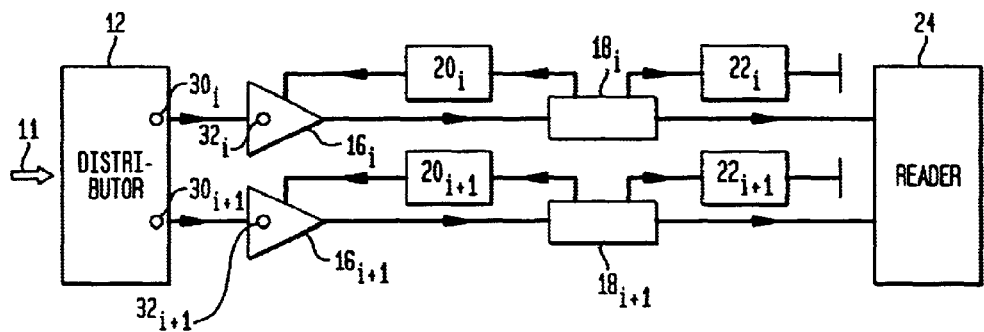
FIGS. 2A–2E depict functional components of two channels of the discrete amplifier during various operational conditions of a discrete amplifier, in accordance with an embodiment of the present invention.

FIG. 2A depicts an initial condition at an instant wherein input signal 11 has provided to distributor 12 a stimulus (e.g., electrons or photons), which distributor 12 distributes or splits into individual, channelized signal components $30_i$ and $30_{i+1}$ that are provided to stimulate respective inputs of amplifiers $16_i$ and $16_{i+1}$ with input signal components $32_i$ and $32_{i+1}$. Insufficient time has elapsed such that amplifiers $16_i$ and $16_{i+1}$ have not yet begun amplifying input signal components $32_i$ and $32_{i+1}$, while sufficient time has elapsed since the arrival of a previous stimulus from input signal 11 such that the other functional elements of amplifier 10 are in their quiescent state. More specifically, there is no charge in integrators $18_i$ and $18_{i+1}$ and hence each respective integrator output voltage Uint equals zero, quantifiers $20_i$ and $20_{i+1}$ each support a voltage on their respective amplifier, so amplifier is ON and waits for a signal charge (i.e., $U_{Amp} > Uon$), an entrance voltage on a governer is 0, the governer is in the closed mode with no current, the charge on the adder is absent.

In FIG. 2A, these amplifier input signal components $32_i$ and $32_{i+1}$ are referenced distinctly from signal components $30_i$ and $30_{i+1}$ to indicate that these former and latter components are not necessarily physically the same components (though they can be the same components). For example, signal components $32_i$ and $32_{i+1}$ may be charged species (e.g., electrons) that are physically distinct from and generated by non-conductive coupling (e.g., capacitive) to charged (e.g., electrons) signal components $30_i$ and $30_{i+1}$. Alternatively, charged signal components $32_i$ and $32_{i+1}$ may be the same physical charged components as signal components $30_i$ and $30_{i+1}$ but represent these components after they are transported (e.g., injected or conducted) to amplifiers $16_i$ and $16_{i+1}$. In yet another implementation, signal components $30_i$ and $30_{i+1}$ may be individual photons, whereas input signal components $32_i$ and $32_{i+1}$ may be photoelectrons corresponding thereto. As described, in practice, such photoelectron conversion may be integrated with the amplifier input or with the distributor 12, or may be separately provided in an intervening element; in any event, such photoelectron conversion is not a necessary function of distributor 12 or amplifier 16 and may be considered a separate function, regardless of whether the element or structure that provides this photoconversion is integrated with the distributor 12 or amplifier 16.

As described, each channelized signal component (each of components $30_i$ and $30_{i+1}$ and, similarly, each of components $32_i$ and $32_{i+1}$) has substantially the same magnitude (though components $32_i$ and $32_{i+1}$ do not necessarily have the same magnitude as components $30_i$ and $30_{i+1}$), which magnitude is independent of the input signal magnitude, and may be any multiple of the fundamental unit or species (e.g., photon or charge unit) comprising input signal 11. In various implementations, however, the signal component magnitude is advantageously implemented as equal to one unit of input signal 11 (e.g., one photon for optical input signals or one charged species (e.g., one electron) for charge input signals). Further, in the event that input signal 11 is an optical signal that is converted to charge units (e.g., electrons) corresponding to components $30_i$ and $30_{i+1}$ and/or components $32_i$ and $32_{i+1}$, in various applications each photon may generate more than one charge, though typically only one charge is generated. In somewhat general terms, then, assuming no losses or inefficiencies in the distributor, it may be understood that assuming input signal 11 provides some integer number N of fundamental units or species to the input of distributor 12, then $\Gamma = \alpha N$ species will be distributed into an integer number K of signal components, each signal component having an equal number $\beta$ of fundamental species or units, and hence N is proportional to K. While $\alpha$ typically equals one, it may be greater than one; for example, where each photon of the input optical signal generates two electrons upon photoconversion. Also, as noted, in a typical implementation, $\beta$ equals one, and hence K=N, indicating that the number of stimulated amplifier channels equals the number of fundamental species in the input signal.

Figure 2B:
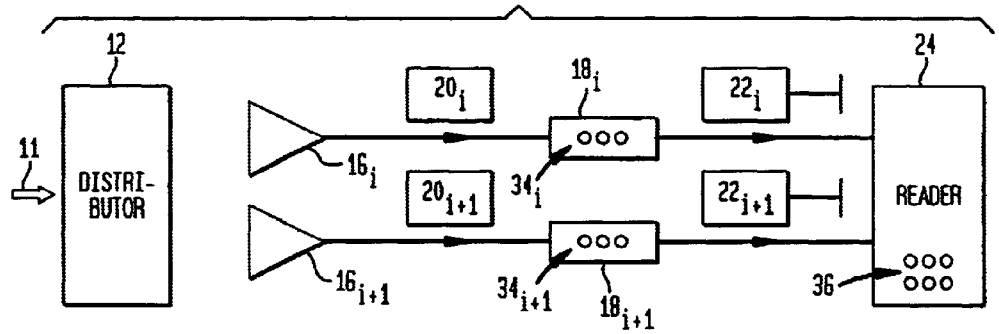

Referring now to FIG. 2B, amplifiers $16_i$ and $16_{i+1}$ have begun amplifying input signal components $32_i$ and $32_{i+1}$ to generate charge that accumulates in integrators $18_i$ and $18_{i+1}$ as charge packets $34_i$ and $34_{i+1}$, which causes the voltage on the integrators to increase. Each of the accumulated charge packets $34_i$ and $34_{i+1}$ and its associated increasing integrator output voltage induces (e.g., by capacitive coupling) charging in reader 24, which in this illustrative operational embodiment is implemented to read or sense the accumulated charge in an "analog" mode. Thus, as schematically depicted, the charge 36 in reader 24 equals the sum of accumulated charge packets $34_i$ and $34_{i+1}$.

Figure 2C:
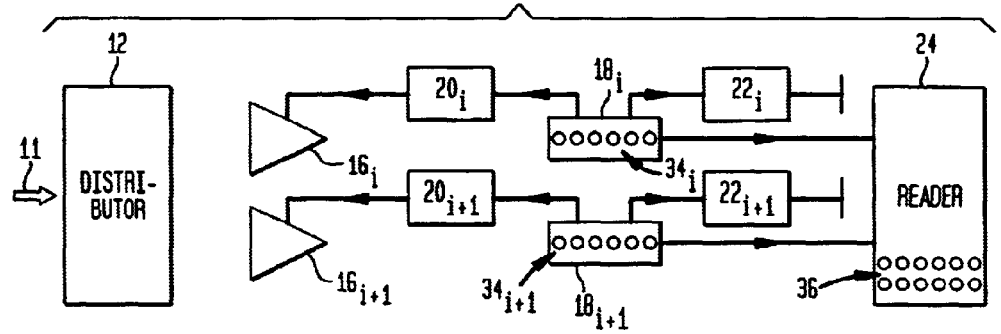

As illustrated in FIG. 2C, amplifiers $16_i$ and $16_{i+1}$ continue amplifying, thus increasing the accumulated charge packets $34_i$ and $34_{i+1}$ and their associated integrator output voltages to a level such that via quantifiers $20_i$ and $20_{i+1}$ (which provide any necessary voltage transformation) the supply voltage of amplifiers $16_i$ and $16_{i+1}$ is reduced to switch amplifiers $16_i$ and $16_{i+1}$ to their respective OFF states. The coupling of the accumulated charge packets $34_i$ and $34_{i+1}$ and their associated integrator output voltages to governors $22_i$ and $22_{i+1}$ causes the input voltages to these governors to exceed the threshold voltage needed for the governors to switch to the open mode; however, because of the built-in opening delay time, governors $22_i$ and $22_{i+1}$ remain in the closed mode, thus allowing only a small leakage current to pass through them. During this time interval, charge 36 in reader 24, which equals the sum of accumulated charge packets $34_i$ and $34_{i+1}$, reaches its maximum value.

Figure 2D:
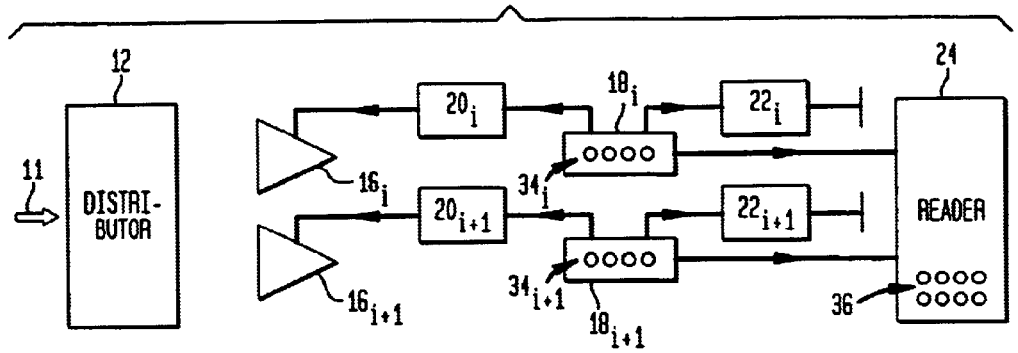

Over the time interval represented by FIG. 2D, governors $22_i$ and $22_{i+1}$ open and the current through each of them grows sharply, thus discharging accumulated charge packets $34_i$ and $34_{i+1}$ and decreasing their associated integrator output voltages.

Figure 2E:
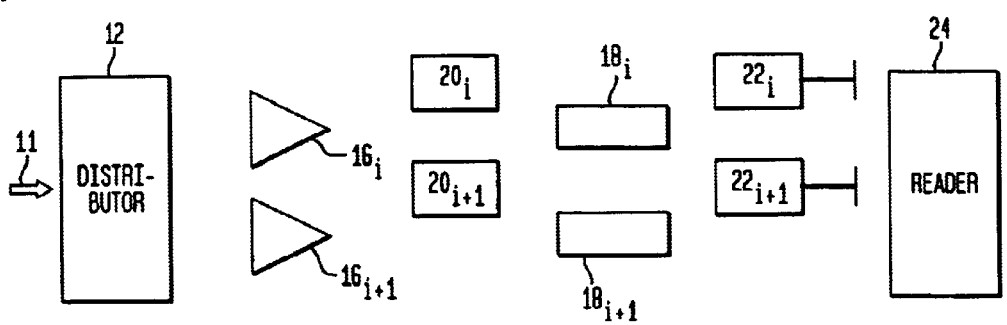

As shown in FIG. 2E, after governors $22_i$ and $22_{i+1}$ completely eliminate (i.e., completely discharge) all accumulated charge in charge packets $34_i$ and $34_{i+1}$, all elements of the discrete amplifier are in an initial state corresponding to FIG. 2A, but before input signal 11 provides a stimulus to distributor 12. Absent any accumulated charge, integrators $18_i$ and $18_{i+1}$ provide a zero voltage output signal that via quantifiers $20_i$ and $20_{i+1}$ causes a sufficient supply voltage to be applied to amplifiers $16_i$ and $16_{i+1}$ such that these amplifiers are switched to their respective ON states, enabling each amplifiers $16_i$ and $16_{i+1}$ to amplify any subsequent signals that may be provided to their respective inputs. Also, there is no charge in reader 24, as there is no accumulated charge in integrators $18_i$ and $18_{i+1}$.

Referring now to FIG. 3, there is shown a schematic cross-sectional view of a portion of a discrete amplifier implemented as a semiconductor device, in accordance with an illustrative embodiment of the present invention. More specifically, FIG. 3 shows only two adjacent amplifier channels (and associated reader structure) from among a total of N such channels, and does not show a distributor structure. As described, the number N of such channels that are implemented in practice depends on the maximum number of species (e.g., electrons) in the input signal.

As shown, the discrete amplifier includes a p-type Si (p-Si) layer 100 (e.g., a substrate or epitaxial layer) in which is formed n+ (i.e., heavily doped n-type) Si conductive regions $102_i$ and $102_{i+1}$ (using the notation, as above, wherein the subscript denotes the associated amplifier channel), thus forming a p-n junction. As is well known, n+ Si conductive regions $102_i$ and $102_{i+1}$ may be formed by, for example, diffusion or ion implantation, and in an alternative embodiment a metal or silicide may instead be used for such regions. Conductive channel-electrodes $103_i$ and $103_{i+1}$ (e.g., heavily-doped (n+) polysilicon) are conductively connected to respective n+ Si regions $102_i$ and $102_{i+1}$ by conductive plugs $108_i$ and $108_{i+1}$ (e.g., metal or heavily doped (n+) polysilicon) which are formed through insulator 104 (e.g., silicon dioxide). Insulator 104 also separates electrodes $103_i$ and $103_{i+1}$ from a common (i.e., shared) conductive electrode 106 (e.g., metal), which is also respectively coupled to electrodes $103_i$ and $103_{i+1}$ by semiconductor plugs $105_i$ and $105_{i+1}$ (e.g., SiC), which have a wider band gap than the bandgap associated with channel-electrodes $103_i$ and $103_{i+1}$.

As may be appreciated, while FIG. 3 schematically depicts device elements and their structural relationship and electrical properties to illustrate components and elements that may be used to implement a discrete charge amplifier in accordance with an embodiment of the present invention, there are many ways of implementing these elements as well as the device design, including a variety of semiconductor fabrication technologies and processes for forming such a device structure and its component layers. For example, while FIG. 3 shows a continuous insulator 104 substantially surrounding channel-electrodes $103_i$ and $103_{i+1}$, in practice, insulator 104 may be formed as more than one insulating layer, possibly using different oxide formation processes (e.g., thermal oxidation of Si, chemical vapor deposition (CVD) techniques), and/or different insulating materials (e.g., silicon dioxide, silicon nitride, etc.). Similarly, channel-electrodes $103_i$ and $103_{i+1}$ may be patterned according to well known techniques, such as by wet or dry etching, or by damascene or dual-damascene (by which conductive plugs $108_i$ and $108_{i+1}$ would also be formed).

As noted, FIG. 3 shows only a portion of the discrete amplifier; for example, it does not show a distributor, nor a second electrode that would be disposed and used to apply a potential across p-Si layer 100 relative to electrode 106, to appropriately bias the discrete amplifier channels during operation. When such bias is applied, amplifiers are provided by avalanche regions $101_i$ and $101_{i+1}$, which are regions of maximal electric field intensity in the p-Si layer. In this embodiment of the invention, avalanche multiplication of charge carriers is used as the amplification mechanism, and it is presumed that the distributor design provides a single charge carrier per channel to be excited. A basic characteristic of the amplifier is the probability that it operates (i.e., initiates avalanche multiplication) in response to a single charge carrier. To increase this probability, the applied voltage is set such that the potential difference across the avalanche regions $101_i$ and $101_{i+1}$ exceeds the breakdown value by at least on one volt. This avalanche breakdown initiation probability may be further enhanced by also implementing the amplifiers (i.e, avalanche regions $101_i$ and $101_{i+1}$) as multi-cascade structures, as described further below in connection with FIG. 4.

In the embodiment of FIG. 3, the quantifier is implemented from conductive regions $102_i$ and $102_{i+1}$ forming with p-Si layer 101 a blocking contact (in this embodiment, a p-n+ junction) for the majority carriers (i.e., holes in this implementation) of the amplifier semiconductor material. In this embodiment, the heavy doping of the n+ conductive regions $102_i$ and $102_{i+1}$ provides for a low minority carrier (hole) concentration in these regions to minimize the dark current due to holes from these regions being swept (e.g., holes within a diffusion length of the junction) into the amplification regions of p-Si layer 101. A basic function provided by the quantifier is switching OFF the amplifiers provided by avalanche regions $101_i$ and $101_{i+1}$ upon accumulation of a required charge package by the integrators provided by channel-electrodes $103_i$ and $103_{i+1}$, with the minimal error (e.g., with minimal variance in the amount of accumulated charge upon effecting turnoff). Accordingly, to more accurately achieve this switching control, as shown in the illustrative embodiment, conductive regions $102_i$ and $102_{i+1}$ are provided as small-area, high radius-of-curvature regions such that they each control small avalanche amplification regions. Additionally, implementing a small area quantifier mitigates the hole current from channel-electrodes $103_i$ and $103_{i+1}$ relative to the collection of electrons from the amplifiers. Further, because of their small areas, to efficiently capture signal carriers each channel may implement more than one quantifier (e.g,. two as shown in FIG. 3, each controlling a separate amplification region) coupled to the integrator for that channel.

As noted, in the embodiment of FIG. 3, the integrator is provided by channel-electrodes $103_i$ and $103_{i+1}$. The integrator is thus connected directly to the quantifier, so that the quantifier may control switching of the amplifier region directly in response to the electrostatic potential of the integrator. As may be appreciated, the integrator capacitance (Cint), and hence the integrator area, is a parameter related to, the designed gain M (i.e., the number of electrons that accumulate in the integrator before the amplifier region is switched OFF via the quantifier) determined by capacity of the integrator.

The governor in this illustrative embodiment is provided by the heterojunction formed between wide-band semiconductor plugs $105_i$ and $105_{i+1}$ and channel-electrodes $103_i$ and $103_{i+1}$ (i.e., which provide the integrator). As described, the governor appropriately discharges the accumulated charge and provides for returning the amplifier regions to their ON conditions after they have been turned OFF by action of the quantifier in response to the accumulated charge reaching the desired gain. As also described, such switching from the Close mode to the Open mode occurs with a delay after the instant that the electric field intensity in amplification area falls below the critical (i.e., breakdown) value, to ensure that the amplifier has sufficient time to switch OFF, thus preventing an uncontrollable microplasma mode that would occur if the amplifier were not switched OFF. In absence of a charge in the integrator, the governor of the illustrative embodiment advantageously facilitates amplifier operation (i.e., maintaining sufficient electric field intensity for avalanche breakdown in the amplifier regions) by allowing dark (i.e., non-signal) minority carriers (i.e., electrons) generated in the space charge region of the p-Si 100 of the amplifier semiconductor to flow as dark current to electrode 106. Note, that in such a mode (Closed), the governor conductivity is sufficiently low such that upon the occurrence of an avalanche current, the minority carriers (i.e., electrons in this embodiment) are primarily accumulated by integrator rather than conducting through the governor to electrode 106.

As may be appreciated, electrode 106 is capacitively coupled via insulator 104 to channel-electrodes $103_i$ and $103_{i+1}$ (i.e., channel integrators), and thus provides for a reader in an "analog" mode.

Figure 4:
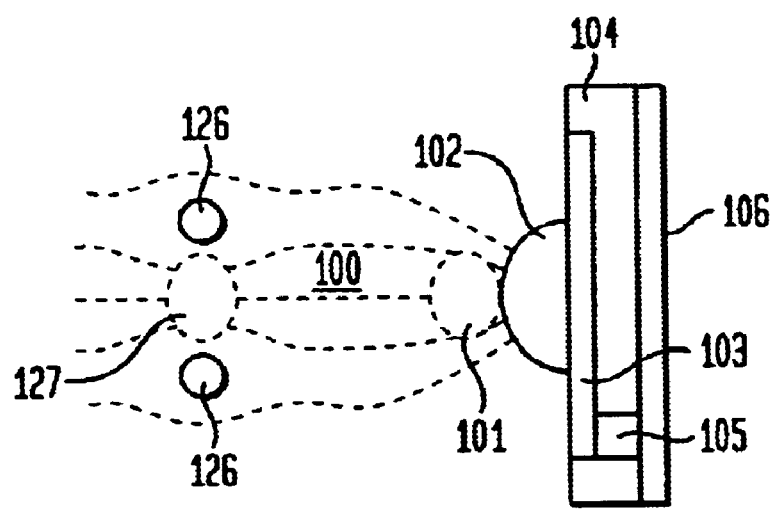
FIG. 4 illustrates two-stage cascade amplification in accordance with an alternative embodiment of the invention.

As noted above, multicascade amplification may be used to enhance the avalanche multiplication probability in response to a single charge carrier stimulus. As an example of such multi-cascade amplification, FIG. 4 illustrates two-stage cascade amplification in accordance with an alternative embodiment of the invention. As shown, embedded within p-Si layer 100 are clusters 126 of a material having a dielectric permittivity less than the dielectric permeability of the surrounding p-Si layer 100 semiconductor material. Accordingly, region 127 between clusters 126 has an enhanced electric field intensity sufficient for avalanche multiplication of an electron entering this region, thus creating an initial charge package, which upon drifting to within region 101 is subject to further avalanche multiplication, i.e., amplifying the initial charge package a second time, to provide a resulting charge package that is accumulated in the integrator provided by channel-electrodes 103. As may be appreciated, therefore, region 127 and region 101 correspond to a first and second amplification stage, respectively. While such a multi-cascade amplifier may be implemented for each of the pairs of amplifier regions of each channel in FIG. 3, alternatively, as shown in FIG. 4, each amplifier channel may employ only one amplifying region, hence having only one associated quantifier n+ Si region 102 which may be directly overlaid (i.e., without an intervening insulator layer and contact plug) by channel electrode 103.

Figure 5A:
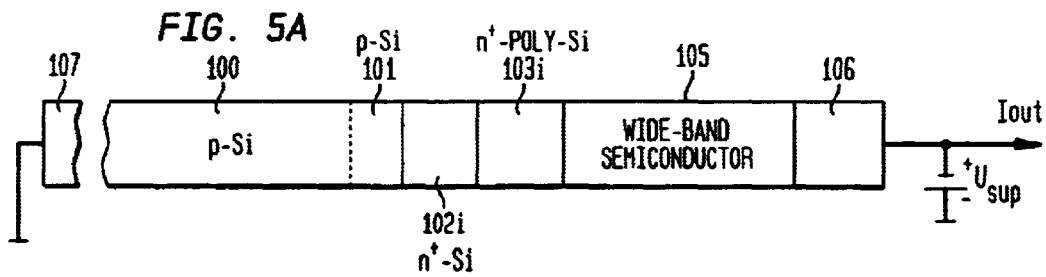
FIG. 5A shows a sequence of material layers corresponding to the structure of FIG. 3.
Figure 5B:
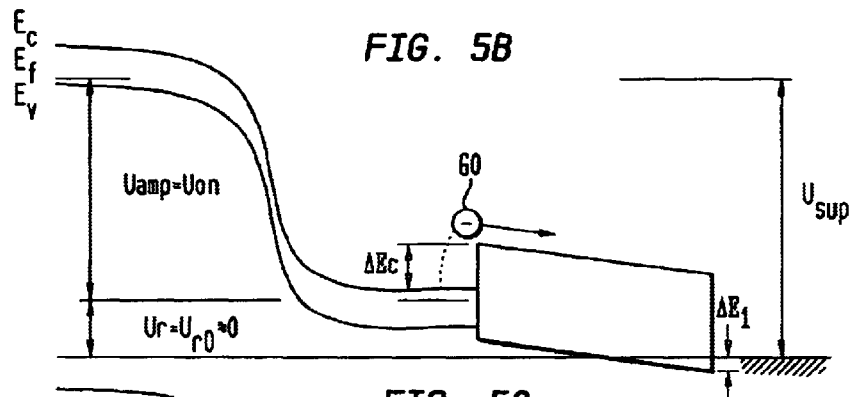
FIGS. 5B–5D depict energy band diagrams corresponding to the material layer structure depicted in FIG. 5A during various operational conditions of a discrete amplifier, in accordance with an embodiment of the present invention.
Figure 5C:
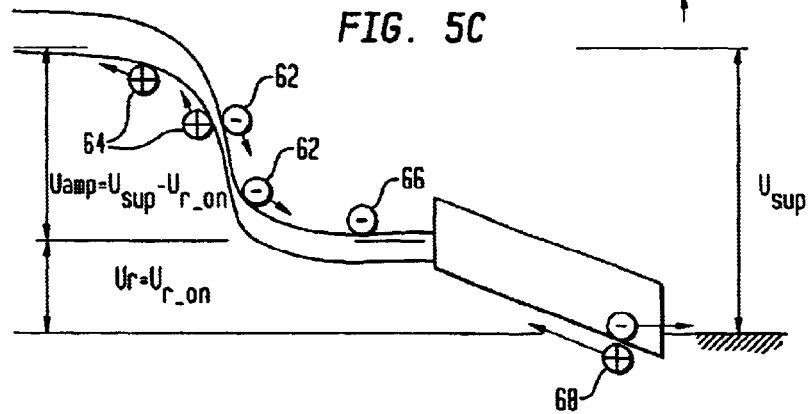
Figure 5D:
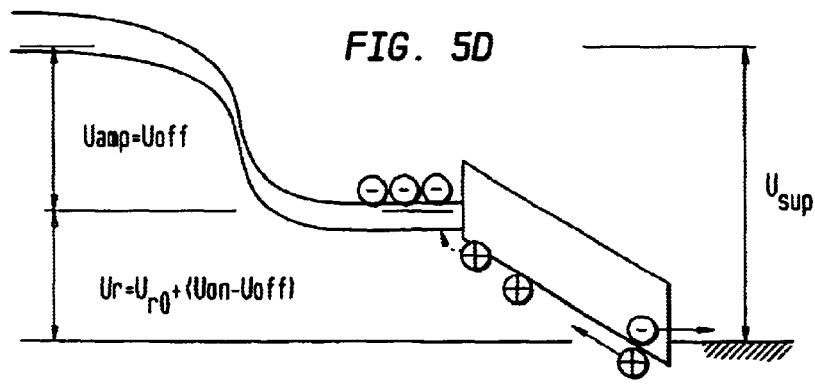

Referring now to FIGS. 5A–5D, the operation of an illustrative discrete charge amplifier such as that of FIG. 3 is described with reference to the energy band diagram for this structure under various operating conditions. More specifically, FIG. 5A shows a sequence of material layers corresponding to the structure of FIG. 3, and also further shows a second electrode 107 that is typically coupled to p-Si layer 100 a p+ layer (not shown), though other intervening layers may be used depending on the implementation. A supply voltage Usup is applied between electrodes 106 and 107, with the polarity as shown to reverse bias p-n+ junction formed between p-Si layer 100 and conductive region $102_i$. FIGS. 5B–5D each depict an energy band diagram along the sequence of material layers shown in FIG. 5A, with the depicted position and displacement along the layers being the same throughout FIGS. 5A–5D for clarity of illustration in associating energy band characteristics with material layers.

Referring now to FIG. 5B, shown is the energy band diagram when the discrete amplifier is in an initial condition corresponding to that described above for FIG. 2E. As is understood, Ec identifies the conduction band energy, Ev identifies the valence band energy, Ef identifies the Fermi level energy, ΔEc denotes the conduction band offset, ΔE1 denotes the energy difference between the valence band of semiconductor plug $105_i$ and the Fermi level in electrode 106 (i.e., ΔE1 is the energy barrier height for holes in electrode 106). The applied voltage Usup is shown distributed primarily between the drop Uamp across p-Si layer 100 (which includes depleted amplifier region $101_i$ which supports most of Uamp) and the drop Ur across semiconductor plug $105_i$ (which provides for the governor), since electrode $103_i$ (i.e., integrator) and conductive (n+) region $102_i$ (i.e., quantifier) have high conductivity and thus the voltage drop on these elements can be considered as negligible. In this initial condition, for convenience Uamp is designated as equal to Uon, and Ur is designated as equal to Ur0.

The governor is in the CLOSED state and the potential difference Ur between electrode $103_i$ (i.e., integrator) an electrode 106 is supported at an approximately constant level due to an approximately constant leakage current through the governor. This voltage drop Ur is also generally small (e.g, about zero) since the leakage current flowing into integrator electrode $103_i$ is very small, as it primarily represents dark current from p-Si layer 100 (which includes amplifier region 101). Thus, the positive potential applied to electrode 106 is transferred to conductive (n+) region $102_i$ (i.e., quantifier) nearly unchanged, and quantifier thus provides for a high electric field across amplifier region $101_i$ such that the amplifier is in its ON state, awaiting an avalanche initiating event.

Leakage current through wide bandgap semiconductor plug $105_i$ (which provides for the governor) is due to different physical mechanisms such as electron thermionic emission from integrator electrode $103_i$ into the wide bandgap semiconductor plug $105_i$ (depicted by electron 60 surmounting ΔEc), as well as electron/hole thermogeneration in wide bandgap semiconductor plug $105_i$. These mechanisms have a weak, non-ohmic dependence on voltage Ur, and thus provide an upper-limit on the leakage current through the governor. As described, this upper limit is sufficient to sink the weak thermogenerated dark current from p-Si layer 100, but any significant increase of current flowing into integrator electrode $103_i$ leads to charge accumulation in the integrator. Accordingly, it is appreciated that in the illustrative embodiment, heterobarrier ΔEc and barrier ΔE₁ are important design parameters for implementing the governor.

Referring now to FIG. 5C, the energy band diagram is shown during a time period in which an initial charge is being amplified by avalanche multiplication in amplifier region 101, corresponding to the condition described in connection with FIGS. 2B and 2C. This avalanche process results in the generation of electron-hole pairs, with the electrons 62 drifting toward conductive (n+) region $102_i$ (i.e., quantifier) and accumulating in integrator electrode $103_i$ (e.g., electron 66), and with the holes 64 drifting toward electrode 107. More specifically, electrons accumulate in integrator electrode $103_i$ since the current (leakage) supported by the governor is much less than the current flowing into the integrator.

The integrator charging causes an increase in the voltage Ur up to the a threshold value (Ur_on) sufficient for the governor to switch to its OPEN mode after a delay. Although the increase in the voltage drop Ur corresponds to an equal (i.e., neglecting other voltage drops) decrease in the amplifier voltage Uamp, the amplifier voltage nevertheless remains above a critical value such that the amplifier continues to generate charge. It is noted that a large value of Uon is generally advantageous as it reduces the average avalanche time required to provide a given multiplication M. By way of example, in practice for a device design based on that shown in FIG. 3, Uon may be selected to exceed the critical voltage by about 5 to 10 volts.

The increase in the voltage drop Ur to Ur_on results in hole generation in the region of semiconductor plug $105_i$ that adjoins electrode 106 (within an electron tunneling distance from electrode 106). More specifically, hole generation is caused by field-assisted (i.e, the field narrows the barrier width) tunneling of electrons from the valence band of wide bandgap semiconductor plug $105_i$ into electrode 106. Equivalently, this process may be understood as field-assisted tunnel injection of holes from the electrode 106 to the valence band of wide bandgap semiconductor plug $105_i$ through the energy barrier $ΔE_i$. Since the heterojunction barrier ΔEc is greater than ΔE₁, outflow of electrons accumulated in integrator electrode $103_i$ by thermionic emission over the barrier ΔEc (or by field assisted emission) is negligible, and charging of Integrator by electrons from the amplifier continues.

The delay between the beginning of hole injection in the semiconductor plug $105_i$ (which provides for the governor) region and the beginning of Integrator discharging is provided by the time for these holes (e.g., hole 68) to drift through semiconductor plug $105_i$. As a result of this delay, integrator charging continues until Uamp is reduced to a value Uoff. This delay, which allows for the amplifier regions 101 to turn OFF before the governor enters its OPEN state, is important too ensure that substantially equal sized charge packets are accumulated at each channel.

As may be appreciated, the height of barrier ΔEc should be high enough to prevent field-induced electron injection (i.e, thermionic field emission or Fowler-Nordheim tunneling) through it up to the maximum voltage on the governor when the amplifier is switched OFF (i.e., up to Ur=$U_{r0}$+Uon−Uoff), thus providing for accumulation of electrons in the Integrators at any governor voltage during operation. Energy barrier ΔE₁ is advantageously selected sufficiently small so that Ur_on is small. Also, it may be understood that it is important that the hole injection process in the region of semiconductor plug $105_i$ (governor) begins before the amplifier region 101 exits from its threshold mode (i.e., Ur_on<Uon−Ucr, where Ucr is the critical voltage).

Since the integrators and electrode 106 are capacitively coupled via insulator 104 (see, e.g, FIG. 3), the electrons accumulated in the Integrators result in a positive "image" charge on electrode 106, indicating that electrons flow from electrode 106 to an external circuit, thus providing output current Iout.

FIG. 5D illustrates the energy band diagram upon commencing the discharging of the accumulated charge to return the discrete amplifier to its initial condition, and corresponds to conditions described in connection with FIGS. 2C and 2D. More specifically, Uamp has been reduced to a value Uoff during the described delay time, which time is expired as the injected holes have traversed the governor and reached integrator electrode $103_i$, thus initiating discharging by recombination with the accumulated charge, corresponding to the governor being in the OPEN mode. During the time interval between the amplifier being switched to its OFF state and just prior to discharging commencing, the voltage across the semiconductor plug $105_i$ (governor) remains substantially constant at a value Ur=$U_{r0}$+Uon—Uoff. The rate of Integrator discharging depends on hole injection current, which is determined by the energy barrier height ΔE₁.

During the discharging process, the voltage Ur decreases and upon reaching about Ur_on, hole injection stops;

however, holes already injected into semiconductor plug 105$_i$ (governor) continue to drift to the integrator, thus rapidly and completely discharging the accumulated charge and concomitantly returning voltage Ur to U$_{r0}$ and, via conductive region 102$_i$ (quantifier), restoring Uamp to Uon (i.e., returning the amplifier to its ON state), which is greater than the critical voltage by a designed amount. Accordingly, the discrete charge amplifier is restored to its initial state, as described in connection with the band diagram of FIG. 5B and with the operational description of FIG. 2E.

It is further noted that in the illustrative embodiment it is important for the electric field strength in amplifier region 101 to return to a level sufficient for avalanche multiplication before the integrator is fully discharged. If, however, a free carrier appears in amplifier region 101 before the channel is fully recovered (i.e., before the integrator is fully discharged and the voltage Uon is across the amplifier region 101), then this free carrier will (according to the relevant avalanche probability) be amplified, but with an avalanche multiplication coefficient less than designed. Such pre-full-recovery amplification represents an amplification noise source. Accordingly, to diminish this effect, the integrator discharging process should minimize the time for Ur to reach to U$_{r0}$ (i.e., there should be a fast transition of the amplifier region 101 from its OFF state to its designed ON state). As may be appreciated, the mechanism provided to delay the governor switching from the OPEN mode the CLOSED mode enables such rapid discharging.

As may be appreciated, depending on the application, the illustrative portion of a discrete charge amplifier shown in FIG. 3 may be implemented with a variety of material layer structures between electrode 107 and p-Si layer 100 and/or a variety of distributor structures to provide an electron stimulus to a given number K of amplifier channels. Accordingly, its description has been set forth without specifically showing a distributor, and has focussed on describing the charge amplification, accumulation, readout (e.g., summation), and discharging/resetting operations. Additionally, however, those skilled in the art recognize that there are myriad alternatives semiconductor device designs for implementing even the functional portion of the discrete charge amplifier depicted in FIG. 3. The ensuing description provides illustrative embodiments that show, by way of example, distributing charge and optical input signals, coupling the distributed signals into amplifier channels, as well as alternative device designs for implementing a discrete charge amplifier.

Figure 6A:
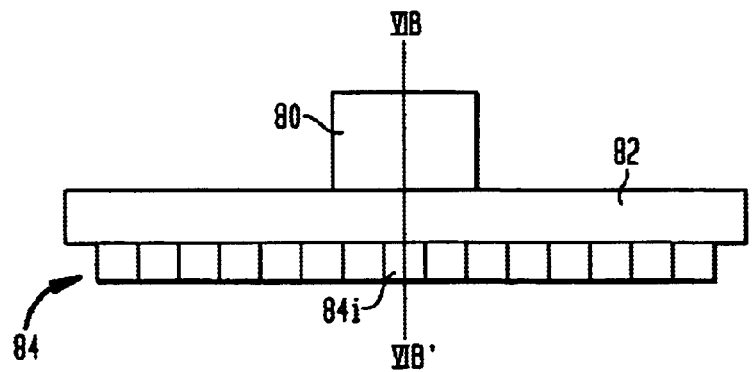
FIGS. 6A and 6B schematically depict a plan view and cross-sectional view, respectively, of a charge-coupled device (CCD) charge splitter to demonstrate an illustrative way of splitting charge to effect the distributor function in accordance with various embodiments of the present invention.

Initially, with reference to FIGS. 6A (plan view) and 6B (cross-sectional view), there is shown a charge-coupled device (CCD) charge splitter to demonstrate an illustrative way of splitting charge to effect the distributor function in accordance with various embodiments of the present invention. This illustrative CCD charge splitter may be described as follows, which for clarity does not explicitly specify materials, any doping regions or layers, inter-electrode isolation or gaps, etc. As schematically depicted, electrodes 80, 82, and multistage electrode 84 are formed on an insulator 86, which overlies a semiconductor material 88. Multistage electrode 84 is comprised of multiple independent, commonly driven gates or, similarly, multiple electrostatically isolated channels (e.g., isolated by interelectrode gap potential barriers). Alternatively, multistage electrode 84 may be a single, common electrode overlying independent amplifier channels such that charge transferred into a common potential well formed by electrode 84 may be channelized by operation of the amplifier channels.

Figure 6B:
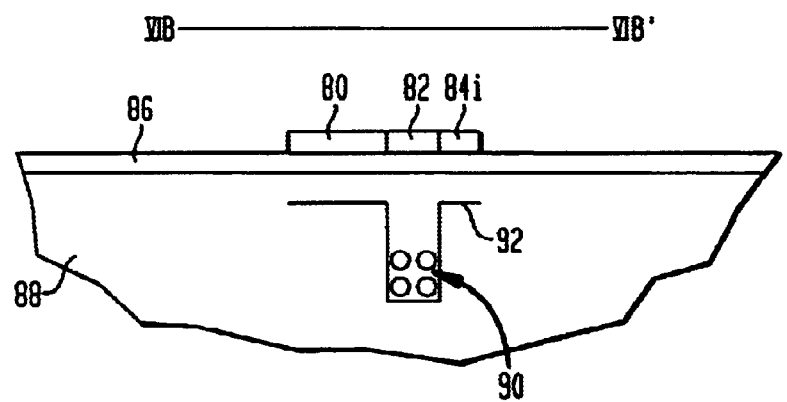

Initially, an input charge signal is localized in a potential well under an electrode 80. By appropriately clocking (driving) the gates, this charge is first transferred to be localized in the semiconductor material in a potential well disposed below electrode 82, as schematically depicted in FIG. 6B by charge 90 and potential well 92. The charge spreads out and distributes itself evenly in this potential well over the entire areal extent of the electrode 82. Then, upon a further clocking operation, this charge is transferred into independent potential wells located under each of the channel electrodes comprising multichannel electrode 84, thus effecting even splitting of the input charge signal. If there are a sufficient number of independent channels associated with electrode 84, then it is possible to ensure, within a statistical metric, that for a given maximum sized input charge packet that the splitting results in K channels of individual electrons. Accordingly, as previously noted, the required number of splitter/amplifier channels is defined by required dynamic range and noise level of registration (i.e, discrimination level) of a signal.

It is understood that the charge-coupled splitter may be applied to myriad discrete charge amplifier designs and, for example, may be integrated with the discrete charge amplifier structure depicted in FIG. 3 to provide electron input signals to a number K of the amplifier channels, the number K being proportional to the input signal magnitude. Those skilled in the art understand that there are various ways of implementing electrode 107 of FIG. 5A in conjunction with the charge-coupled splitter design. For instance, the charge-coupled splitter may transfer charge in a light or moderately doped p-layer which overlies a p$^+$ layer that is contacted at the periphery of charge-coupled splitter to provide for electrode 107.

While the charge-coupled splitter is well suited for splitting charge in a variety of semiconductor based designs, the underlying principle of coupling (e.g, by charge transport, or by capacitive coupling) an input charge signal from a smaller area to a larger area, thus spatially distributing the charge, which can then be directed into individual amplifier channels, may be implemented in a variety of ways in diverse implementations, including vacuum and solid state embodiments of a discrete amplifier according to the present invention.

Figure 7A:
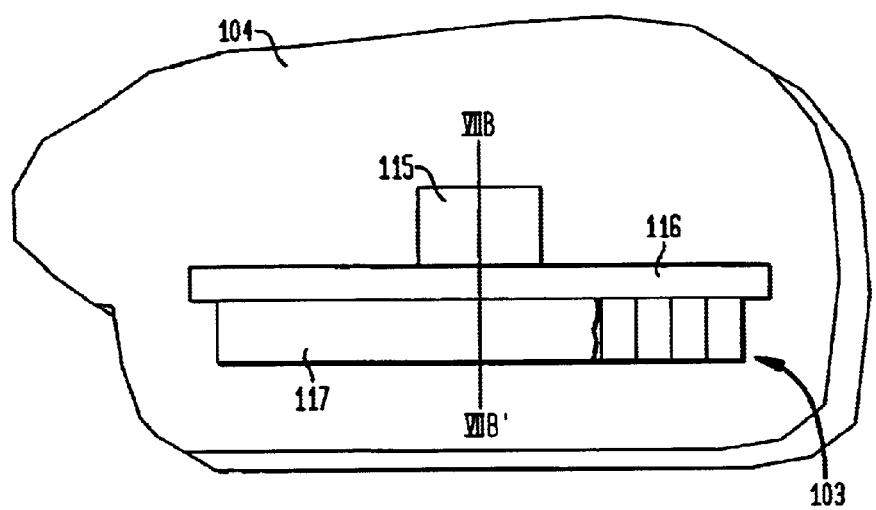
FIG. 7A and FIG. 7B respectively show a plan view and a cross-sectional view of a discrete amplifier based on CCD technology, in accordance with an embodiment of the present invention.
Figure 7B:
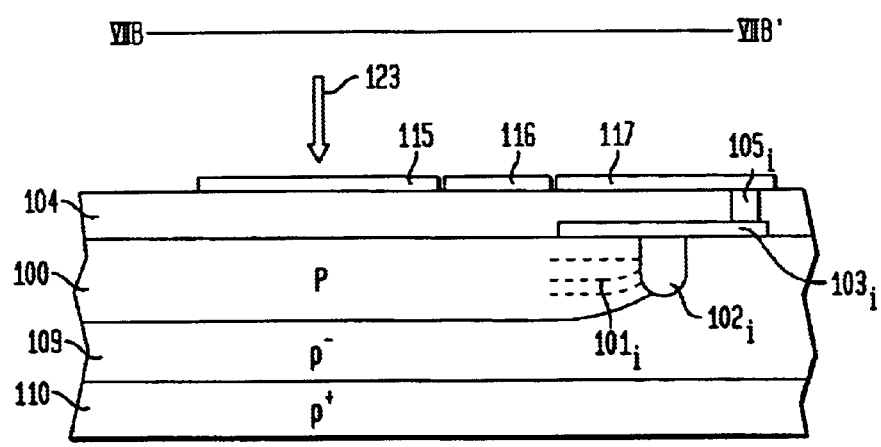

FIG. 7A and FIG. 7B respectively show a plan view and a cross-sectional view of a discrete amplifier based on CCD technology. As shown in the cross-sectional view of an area of one amplifier channel (i.e, FIG. 7B), this illustrative embodiment of a discrete amplifier is designed to provide for a generally lateral charge transport during avalanche multiplication in the amplifier region 101 of Si p-layer 100.

This illustrative embodiment generally includes three charge-coupled regions: a charge storage area associated with storage electrode 115, a charge splitting area associated with splitting electrode 116, and a charge amplification area associated with amplification electrode 117. The amplification area associated with amplification electrode 117 provides for discrete amplification and includes N channels located under the common amplification electrode 117. The discrete amplifier is based on a heavily doped p+ silicon (Si) substrate 110, which is used as one of the discrete charge amplifier electrodes. Overlying this Si substrate 110 is an epitaxial, low doped (p−) layer 109 (e.g., doped to a concentration of about $10^{13}$–$10^{14}$ cm$^{-3}$ and having a thickness of about 5–10 micron, which prevents parasitic avalanche breakdown outside the amplification area 101). In the storage and splitting areas, and in part of the amplification area, low-doped (p−) layer 109 is overlaid by a p-type layer 100 (e.g., doped at a concentration of about $10^{15}$–$10^{16}$ cm$^{-3}$ and having a thickness of about 2–3 microns). Materials and/or structures corresponding to those in the discrete amplifier embodiment of FIG. 3 are referenced by the same numbers. More specifically, the discrete charge amplifier of FIGS. 7A and 7B includes an avalanche amplification area 101, a quantifier 102, an integrator 103, and a governor 105, corresponding to the equivalently referenced structures/materials in FIG. 3. In FIG. 7A, amplification electrode 117 is depicted as partially removed (torn away) to expose underlying integrators 103 for clarity of illustration.

As described for the charge-coupled splitter of FIGS. 6A and 6B, a charge signal to be detected (amplified and recorded) is stored in a potential well formed under an storage electrode 115. As may be understood, this signal may originate in many different ways. For example, it may represent (directly or indirectly) charge generated by other electrical circuitry on the same semiconductor substrate, or may alternatively result from photoconversion of an optical signal (e.g., directly detected in the potential well below electrode 115). By way of example, as shown in FIG. 7B, an optical signal 123 is incident directly on and projected through electrode 115 (which is hence made as a transparent electrode; alternatively backside illumination may be used), thus generating a charge packet in the potential well controlled by storage electrode 115.

The charge packet thus stored under electrode 115 is first transferred by charge coupling to a potential well formed under splitting electrode 116, thus spatially distributing the charge. Next, the charge packet is transferred and split into individual electrons by charge coupling into individual amplifying channels disposed beneath amplifier electrode 117. In effecting this transfer with amplifier electrode 117, the operating avalanche voltage is applied via electrode 117, and hence the individual, channelized electrons undergo avalanche amplification in amplifier region 101, resulting in charge accumulation in the integrators 103, which can be read out using electrode 117, which is capacitively coupled in common to the integrators of all channels. As described for the above embodiments, governor 105 is operative in discharging the integrators 103.

While the above embodiments illustrate distributing an optical or electrical input signal in the charge domain, alternative embodiments of the present invention may also provide distribution of optical signals entirely, or at least in part, in the optical domain. In accordance with the present invention, FIG. 8 illustrates an illustrative embodiment of a discrete amplifier that employs distribution in the optical domain.

A heavily doped silicon ($p^+$) substrate 210 is used as one of the electrodes, and an epitaxial Si layer is disposed over substrate 210 to provide for the discrete amplifier channels 113. Since in this embodiment the input optical signal is incident from the heavily doped silicon ($p^+$) substrate 210, to reduce the optical losses, the semiconductor substrate in the channel area is advantageously etched to a width not exceeding about one or several microns. Conductive (e.g., metal) electrodes 107 are formed on the thick edge portions of heavily doped substrate 210. The second electrode contact is provided by electrode 106 which is formed on insulator 104. A light signal is incident on the discrete amplifier through optical splitter (distributor) 112, which adjoins heavily doped Si substrate 210 via an intervening anti-reflective coating 111 provided on the substrate.

Figure 9:
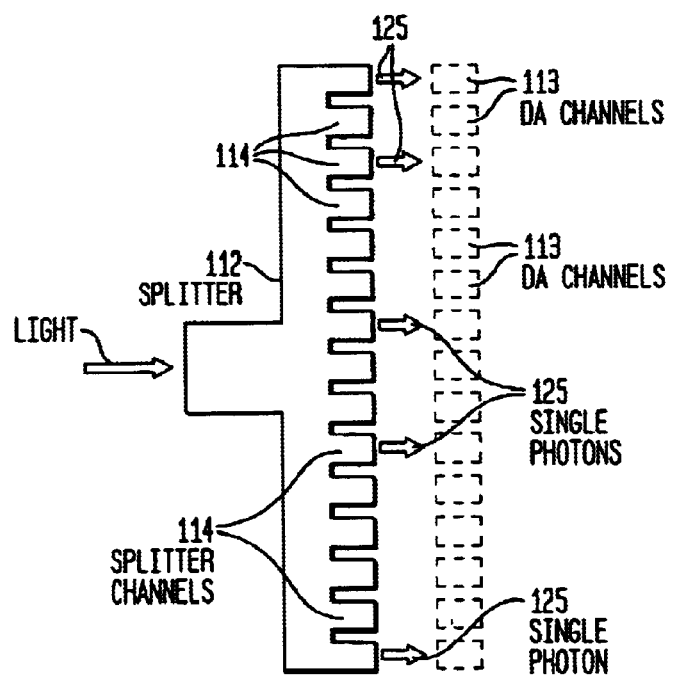
FIG. 9 illustrates an optical splitter made in the form of a fiber optic plate, in accordance with an embodiment of the present invention.

FIG. 9 illustrates an embodiment of a splitter 112 made in the form of a fiber optic plate allocating the light signal projected onto a narrow input part of the splitter among individual discrete amplifier (DA) channels 113. More specifically, as shown, a respective optical waveguide (e.g., respective optical fibers, shown as splitter channels 114) of splitter 112 is coupled to each discrete amplifier channel 113, and the output of a single optical fiber that guides the input optical (e.g., light) signal is distributed in parallel among these respective optical waveguides comprising splitter channels 114. As schematically depicted, in this illustrative embodiment, the splitter channels provide single photons 125.

Figure 8:
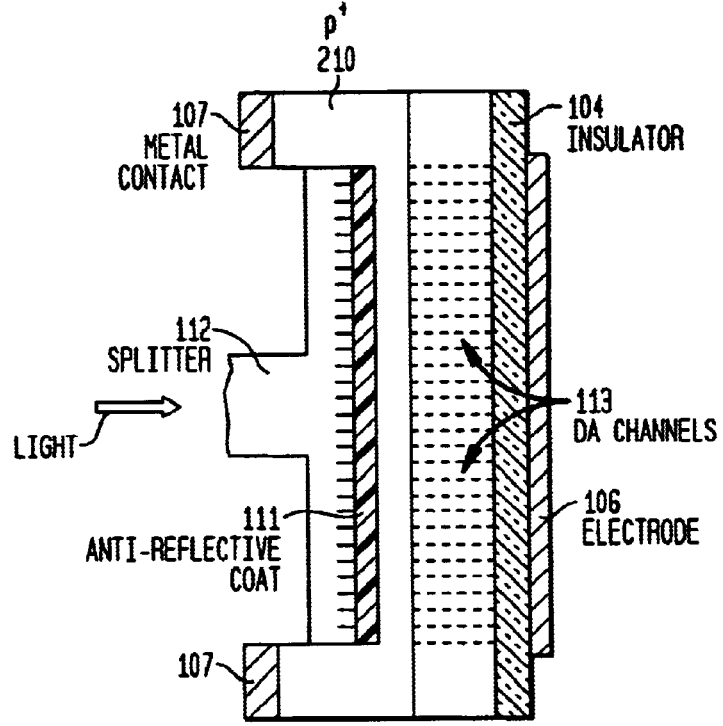
FIG. 8 illustrates a discrete amplifier that employs distribution in the optical domain, in accordance with an embodiment of the present invention.
Figure 10:
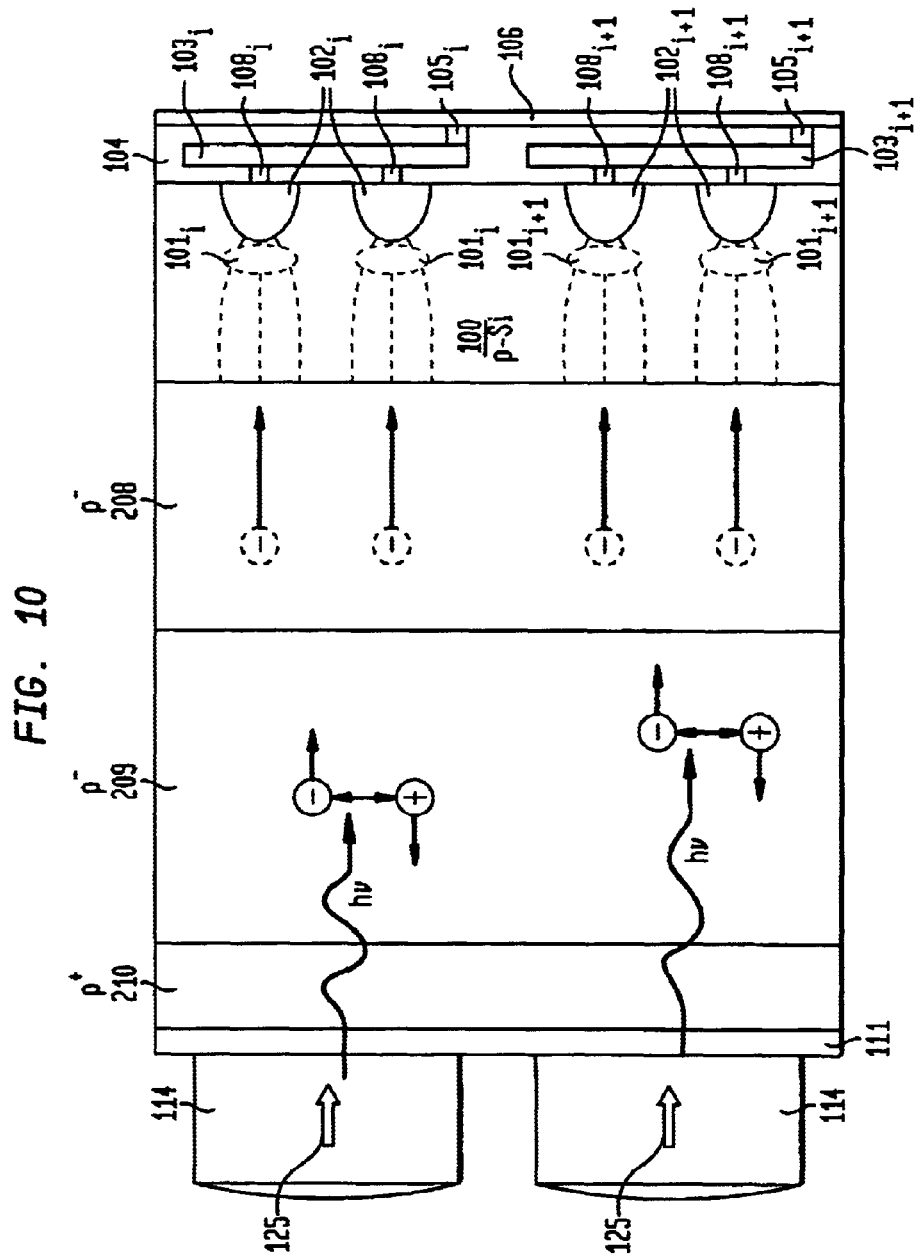
FIG. 10 is cross-sectional view of the discrete amplifier of FIG. 8, but magnified to focus on the area of two adjacent channels, in accordance with an embodiment of the present invention.

FIG. 10 is cross-sectional view of the discrete amplifier of FIG. 8, but magnified to focus on the area of two adjacent channels. As shown, adjoining the heavy doped Si substrate 210 is a lightly doped p-Si epitaxial layer 209, which functions as a photoconverter (i.e., generates electrons by absorbing incident photons). By way of example, layer 209 is doped at a concentration of about $10^{13}$–$10^{14}$ cm$^{-3}$, and has a width selected based on the absorption depth for the long-wave boundary of the spectral range of the optical signal to be detected, and is typically not less than 10 microns. Silicon layer 208 functions as a transporter (i.e., transporting photogenerated electrons to the amplifying region), and in this embodiment has the same doping level and thickness as photoconverter layer 209, thus providing for high quantum efficiency.

In operation, the optical signal to be detected is incident on the narrow front portion of the splitter 112, which distributes the optical signal over the individual splitter output channels 114 in such a manner that not more than one photon is allocated for each DA channel. These photons pass through anti-reflective coating 111 and the heavily doped Si substrate 210 layer, and then are absorbed in photoconverter 209 and in transport Si layer 208, thus creating electron-hole pairs. The electric field separates the electrons and holes, leading the holes to an external circuit through Si substrate 210 and further through the metal electrode 107, and sweeping the electrons through transport layer 208 into the amplification area within p-Si layer 100.

Figure 11A:
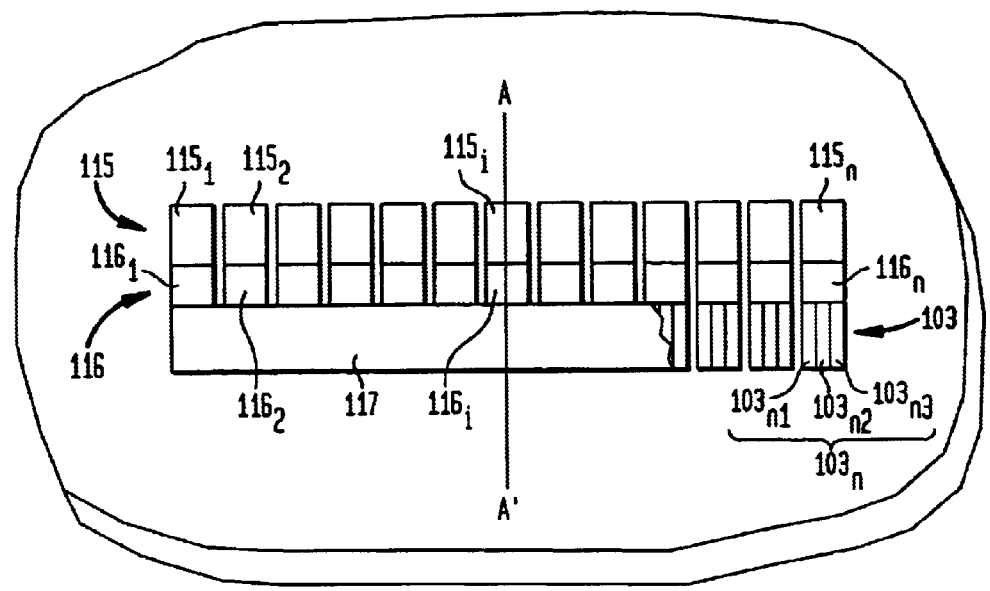
FIGS. 11A and 11B illustrate an embodiment of a discrete amplifier that employs both optical splitting and charge domain splitting, in accordance with an embodiment of the present invention.
Figure 11B:
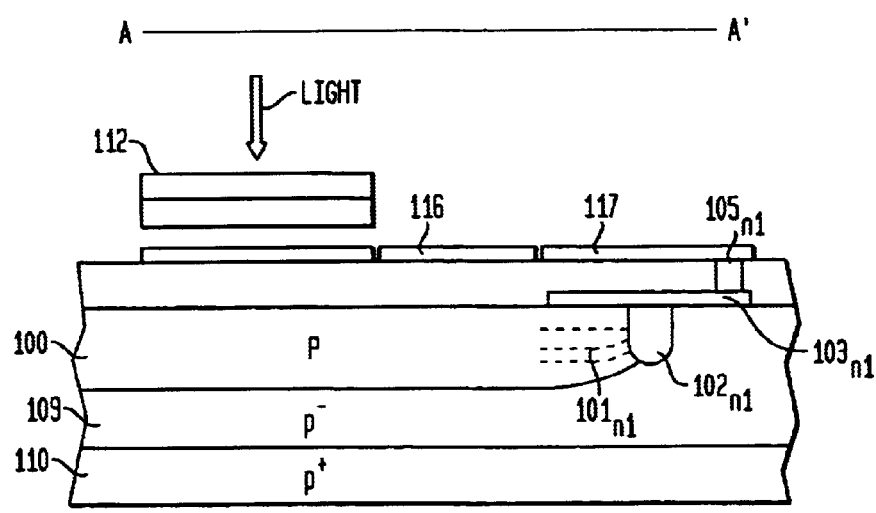

Referring now to FIGS. 11A and 11B, illustrated is an embodiment of a discrete amplifier that employs a CCD type structure for transferring and distributing charge into amplifier channels (similar to the device of FIGS. 7A and 7B) and also employs optical domain splitting using optical splitter 112. More specifically, FIG. 11A shows a plan view of the discrete amplifier with CCD type splitting (not showing optical splitter 112) that is shown in cross-section in FIG. 11B along with optical splitter 112. FIG. 12 illustrates an embodiment of optical splitter 112 made as a fiber-optic linear array dividing the light signal, projected on the narrow input part of the splitter onto the separate channels (i.e., $115_1, 115_2 \ldots 115_i \ldots 115_n$) of the storage area associated with electrode 115. Photoelectrons in the separate storage areas are then subject to signal splitting in the charge domain, i.e., two stages of signal splitting are provided.

In this embodiment, since splitting occurs in the optical domain, the storage electrode 115 and splitting electrode 116 and associated underlying regions are multichannel (the individual storage electrode channels indicated by $115_1$, $115_2 \ldots 115_i \ldots 115_n$, and the individual splitting electrode channels indicated by $116_1, 116_2 \ldots 116_i \ldots 116_n$), the number of channels being equal to the number of channels of optical splitter 112. In an illustrative implementation of such a discrete amplifier, the optical signal being recorded is first divided by the splitter 112 into individual photons. As described, the number of channels of the optical splitter is determined based on a required dynamic range of the light signal being detected, i.e. the maximum number of photons in the light pulse. Assuming the photons may have energies allowing for more generating more than one photoelectron per photon, some of the charge storage areas 116 may have more than one electron. Charge domain splitting of each of these separate sets of electrons (i.e., each set associated with an output channel of the optical splitter) distributes the sets of electrons into separate (individual) electrons at the output of the charge splitter (each charge splitter output associated with a separate charge amplifier channel and integrator 103). As indicated by FIG. 11A (which depicts electrode 117 as partially removed (torn away) to expose underlying integrators 103 for clarity of illustration), in this illustrative embodiment, each optical splitter output channel is associated with three charge domain splitter output channels. More specifically, as shown for the $n^{th}$ optical splitter output channel, storage electrode channel $115_n$ is coupled to splitting electrode channel $116_n$ which is charge coupled to split charge among three independent amplifying channels respectively associated with integrators $103_{n1}, 103_{n2}, 103_{n3}$ that are collectively referenced as $103_n$ to indicate that they are associated with the $n^{th}$ optical channel. (Similar notation is used in FIG. 11B to reference elements associated with the second (of three) independent amplifier channel associated with the $i^{th}$ optical channel, i.e., integrators $103_{n1}$, integrators $103_{n1}$, integrators $103_{n1}$, integrators $103_{n1}$, Since the size of an output signal in this illustrative implementation of a photon sensing discrete amplifier is a function of the photon energy, this embodiment allows for estimating the photon energy based on the photodetector itself without using spectral devices. For example, if the charge splitter output channels associated with a single optical splitter output channel provides a signal indicating that two (of the three) amplifiers was excited, then that optical channel was excited by a photon having an energy greater than twice the bandgap energy. Alternatively, if the charge splitter output channels associated with a single optical splitter output channel provides a signal indicating that one (of the three) amplifiers was excited, then that optical channel was excited by a photon having an energy less than twice the bandgap energy (but at least equal to the bandgap energy).

Thus, by using, for example, a "digital" readout mode, a spectral measurement of the input signal is provided. Also, this implementation also allows for completely excluding the thermal noise effect when single photons having sufficiently high energy at room temperature or even at a higher operating temperature. Alternatively, even in implementations where input photons do not have sufficient energy to generate more than one electron, such splitting in both the optical domain and charge domain may be advantageously used to ensure sufficient overall splitting (based on the dynamic range of the input signal) into, for example, individual electrons that excite the amplifier channels. That is, the optical splitter need not have a sufficient number of channels to ensure (within a statistical metric) splitting into individual photons; however, the charge domain splitting of the photoelectrons ensures splitting into individual electrons (i.e., even where an output channel of the optical splitter provides more than one photon).

In the foregoing description of illustrative embodiments of the present invention, reference is made to the distributor providing output signal components each having a given number of fundamental signal components to within a given (e.g., specified, known, or designed) statistical metric. As also described, the number n of channels over which distributor 12 is capable of providing a signal component is selected based on the dynamic range of the input signal 11 to be sensed. For clarity of exposition, by way of example, consider that an input probability Pn that two or more photons would impinge upon the same cell depends on a splitting factor, $\lambda=k/n$, where n is the number of cells (e.g., output channels of the distributor) and k is the number of incident photons. The value of $\lambda$, providing some given probability Pn, may be calculated numerically from the expression $Pn(\lambda)=1-e^{\lambda}(1+\lambda)$. Thus, depending on the application, for a particular value of k, the number of cells n would be selected as large as necessary to provide a desired Pn.

As noted above, while for ease of clarity of exposition, above illustrative embodiments of the invention are set forth according to distributor 12 providing equal sized output signal components (typically of one fundamental unit), the present invention may be implemented with distributor 12 providing any known sized output signal components (i.e., not necessarily equal nor necessarily unit sized). For example, each signal component output by distributor 12 may be equal sized but greater than one fundamental unit in size. Alternatively, for example, different outputs of the distributor may provide output signal components of different known sizes (e.g., distributor output channel j outputs $2^j$, with the sum over all output distributor channels being equal or proportional to the input signal magnitude). Advantageously, where a distributor channel outputs a given sized signal, the corresponding amplifier to which that distributor channel is coupled (i.e., the amplifier channel excited by that distributor channel) is designed as a threshold amplifier having its threshold for initiating amplification equal to the given sized signal output by the corresponding distributor channel.

FIGS. 13A–D depicts an illustrative embodiment of a charge distributor that provides different known sized signal components at each of its outputs. The charge distributor includes a buffer field electrode 130 having an associated potential well containing an initial signal charge package, a field electrode 131 having an associated potential well with a capacity of two electrons, a field electrode 132 having an associated potential well with a capacity of four electrons, and field electrodes 133 and 134 each having an associated potential well with a capacity of eight electrons (each field electrode and its associated potential well are hereafter commonly referenced). The charge distributor also includes resistors R1, R2, R3, R4, which divide the voltage supplied by power supply 137 to provide the required voltage on the field electrodes.

Figure 13A:
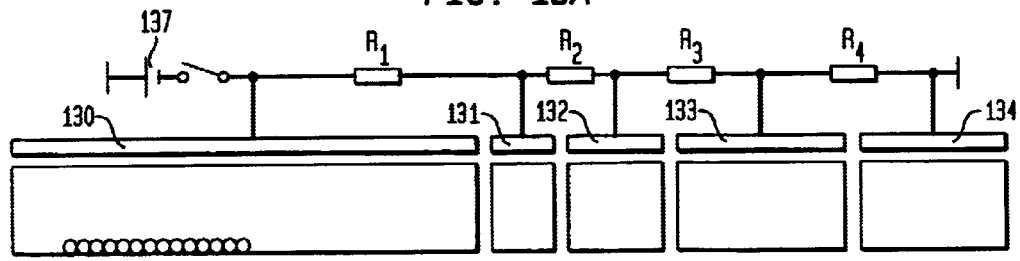
FIGS. 13A–D depict an illustrative embodiment of a charge distributor that provides different known sized signal components at each of its outputs, in accordance with various alternative embodiments of the present invention.
Figure 13B:
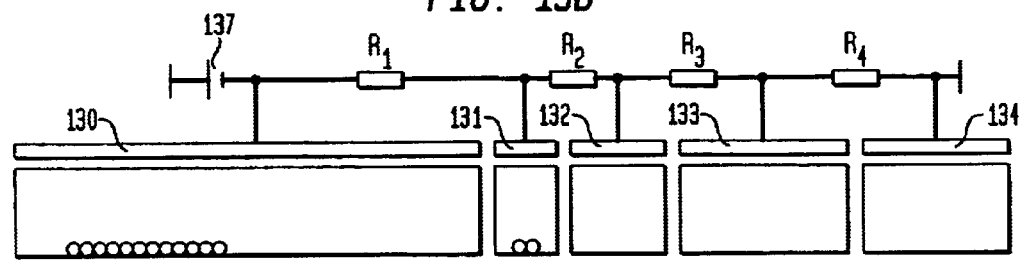
Figure 13C:
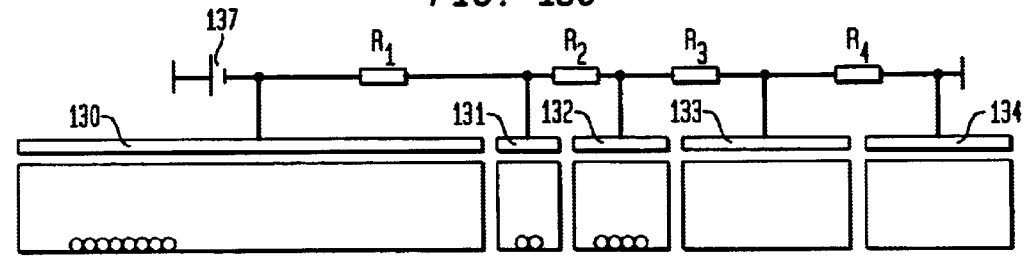
Figure 13D:
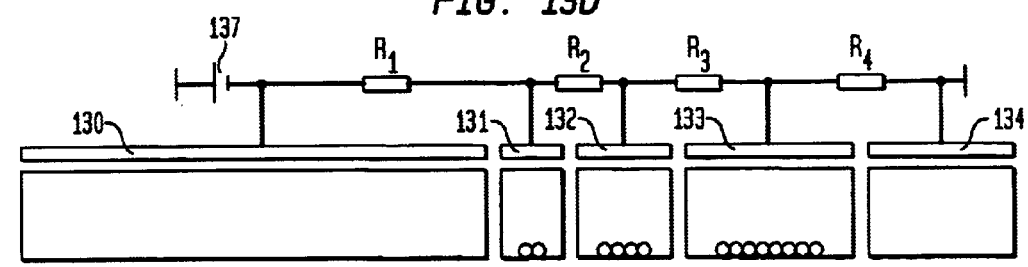

Referring to FIG. 13A, initially power supply 137 is switched off and an initial charge package consisting of sixteen electrons, is in a buffer potential well under buffer electrode 130. After switching to apply the voltage of power supply 137 to the field electrodes, the associated potential wells 131, 132 and 133 are filled sequentially according to their capacities (FIGS. 13B, 13C, 13D). Potential well 134 remains empty as the entire initial signal package is redistributed among potential wells 131, 132 and 133. Thus, as may be appreciated, a distributor may distribute an input signal into different known sized signal components by distributing or transferring charge among potential wells of different capacity. As may also be appreciated, different potential wells (and possibly all the wells) may be provided with the equal (but not necessarily unit sized) capacities.

In view of the foregoing description of illustrative and preferred embodiments of the present invention, various illustrative variations or modifications thereof, and various background art, it may be appreciated that the present invention has many features, advantages, and attendant advantages. For example, a feature associated with an embodiment of the present invention is that by self-limiting the gain of each of the independent amplifier channels that are excited or stimulated with approximately the same number of input electrical charge, and which contribute equally to the output signal, the noise factor is substantially improved, and concomitantly enhancing immunity to spurious events, such as dark current induced avalanche multiplication.

Additionally, while the foregoing illustrative embodiments, for clarity, describe detecting a single input signal, those skilled in the art understand that the present invention is not limited to single input signal detection, but, for example, may be applied to concurrent and/or simultaneous detection of multi-channel input signals as well as to image detection. For instance, in wavelength division multiplexing applications, the optical signal of each wavelength channel may be detected using a separate discrete charge amplifier in accordance with the present invention. Similarly, to detect a one or two dimensional image, for example, each pixel corresponding to the image may be associated with a separate discrete charge amplifier. In such multi-channel or imaging applications, the photons corresponding to each channel or pixel may be divided in either the photon domain or charge domain among the discrete charge amplifier channels. By way of example, the wavelength channels or image may be coupled into an optical fiber bundle (e.g., a fiber image guide), wherein each optical fiber represents a wavelength channel or pixel and guides the photons corresponding to that channel or pixel to a separate discrete charge amplifier, with the photon signal for a given channel or pixel (i.e., guided by a give optical fiber) being divided in the optical domain (e.g, by using an optical splitter at the end of the optical fiber) and/or the electrical domain (e.g., using a charge-coupled splitter to distribute an electrical signal corresponding to the photoconversion of the entire photon packet guided by the optical fiber).

Although the above description provides many specificities, these enabling details should not be construed as limiting the scope of the invention, and it will be readily understood by those persons skilled in the art that the present invention is susceptible to many modifications, adaptations, and equivalent implementations without departing from this scope and without diminishing its attendant advantages. It is therefore intended that the present invention is not limited to the disclosed embodiments but should be defined in accordance with the claims which follow.

What is claimed is:

1. A method providing for the detection of a spatially localized input signal, comprising:
  generating from said spatially localized input signal a plurality of spatially separate elementary charge components, each having a respective known number of elementary charges independent of the magnitude of said spatially localized input signal, the number of said plurality of spatially separate elementary charge components being a known monotonic function of the magnitude of said input signal; and
  independently amplifying each of said plurality of spatially divided elementary charge components to provide a respective plurality of signal charge packets, each signal charge packet having a second number of elementary charges greater than said respective known number by a respective amplification factor.

2. The method according to claim 1, wherein the number of said plurality of spatially separate elementary charge components is proportional to the magnitude of said input signal.

3. The method according to claim 1, wherein each of said plurality of signal charge packets has a sufficient second number of elementary charges to provide for detection thereof.

4. The method according to claim 1, wherein the independent amplification of said plurality of spatially divided elementary charge components provides each of said plurality of signal charge packets with substantially the same said second number of elementary charges.

5. The method according to claim 1, wherein said plurality of spatially separate elementary charge components each have substantially a same first number of elementary charges, the respective known numbers thereby each being substantially equal to said first number.

6. The method according to claim 5, wherein the same first number of elementary charges contained in each spatially separate elementary charge component is one to within a statistically significant metric.

7. The method according to claim 1, wherein said spatially localized input signal is an optical signal, and said spatially separate elementary charge components are provided by splitting said optical signal into a plurality of photon signal packets.

8. The method according to claim 7, wherein each photon signal packet has one photon to within a statistically significant metric.

9. The method according to claim 7, wherein each of said plurality of photon signal packets has a substantially equal number of photons and is converted into a respective one of said spatially separate elementary charge components.

10. The method according to claim 9, wherein each photon signal packet has one photon to within a statistically significant metric, each photon being converted into one elementary charge such that each said spatially separate elementary charge component has about one elementary charge.

11. The method according to claim 7, wherein said plurality of photon signal packets are converted into a respective plurality of photo-charge signals that are distributed into said spatially separate elementary charge components.

12. The method according to claim 11, wherein each of said plurality of photon signal packets has a substantially equal number of photons.

13. The method according to claim 11, wherein each photon signal packet has one photon to within a statistically significant metric, each photon being converted into a plurality of elementary charges such that each of said photo-charge signals has a plurality of elementary charges, and each of said photo-charge signals is split such that each said spatially separate elementary charge component has about one elementary charge.

14. The method according to claim 1, wherein said spatially localized input signal is an optical signal, and said spatially divided elementary charge components are provided by converting said optical signal to provide an electrical signal, and splitting said electrical signal into each of said spatially divided elementary charge components.

15. The method according to claim 1, wherein said spatially localized input signal is an electrical signal, and said spatially divided elementary charge components are provided by splitting said electrical signal into each of said spatially divided elementary charge components.

16. The method according to claim 15, wherein each spatially divided elementary charge component has one elementary charge to within a statistically significant metric.

17. The method according to claim 15, wherein said electrical signal is provided as the output of a sensor or transducer.

18. The method according to claim 15, wherein said electrical signal is provided as the output of a particle or x-ray sensor.

19. The method according to claim 1, further comprising generating an output signal representing the sum of all of said plurality of signal charge packets.

20. The method according to claim 19, wherein said output signal is provided by capacitively coupling each of said plurality of signal charge packets onto a common electrode.

21. The method according to claim 1, further comprising reading out each of said plurality of signal charge packets individually.

22. The method according to claim 1, wherein each of said plurality of signal charge packets is provided by a dosed charge accumulation mechanism that results in each of said plurality of signal charge packets having a given quantity of charge.

23. The method according to claim 22, wherein said dosed charge accumulation mechanism comprises terminating the independent amplification upon accumulating said given quantity of charge.

24. The method according to claim 22, wherein said dosed charge accumulation mechanism comprises eliminating any excessive charge that exceeds the given quantity of charge.

25. The method according to claim 22, wherein the independent amplification of each of said plurality of spatially divided elementary charge components is provided by avalanche multiplication.

26. The method according to claim 22, further comprising eliminating each of said plurality of signal charge packets after the given quantity of charge has been accumulated.

27. The method according to claim 1, wherein the independent amplification of each of said plurality of spatially divided elementary charge components is provided by multi-stage avalanche multiplication.

28. The method according to claim 1, wherein said spatially localized input signal is a spatially localized portion of a one-dimensional or two-dimensional input signal.

29. The method according to claim 1, wherein said spatially localized input signal is a single channel of a multi-channel input signal.

30. An apparatus providing for the detection of an input signal, comprising:
   means for generating from said input signal a plurality of spatially separate elementary charge components, each having a respective known number of elementary charges independent of the input signal magnitude, the number of said plurality of spatially separate elementary charge components being a known monotonic function of the magnitude of said input signal; and
   means for independently amplifying each of said plurality of spatially divided elementary charge components to provide a respective plurality of signal charge packets, each signal charge packet having a second number of elementary charges greater than the known respective number by a respective amplification factor.

31. The apparatus according to claim 30, wherein the number of said plurality of spatially separate elementary charge components is proportional to the magnitude of said input signal.

32. The apparatus according to claim 30, wherein each of said plurality of signal charge packets has a sufficient second number of elementary charges to provide for detection thereof.

33. The apparatus according to claim 30, wherein the independent amplification of said plurality of spatially divided elementary charge components provides each of said plurality of signal charge packets with substantially the same said second number of elementary charges.

34. The apparatus according to claim 30, wherein said generating means includes a charge coupled splitter.

35. The apparatus according to claim 30, wherein said generating means includes a fiber optic plate.

36. The apparatus according to claim 30, wherein said amplifying means includes an avalanche multiplication device.

37. The apparatus according to claim 36, wherein said avalanche multiplication device includes multi-stage avalanche multiplication.

38. The apparatus according to claim 30, wherein said amplifying means is provided as a semiconductor device.

39. The apparatus according to claim 30, further comprising means for accumulating each of said plurality of signal charge packets.

40. The apparatus according to claim 39, further comprising means for dosed charge accumulation such that each of said plurality of signal charge packets has a given quantity of charge.

41. The apparatus according to claim 40, further comprising means for eliminating said plurality of charge packets after accumulating the given quantity of charge.

42. The apparatus according to claim 41, further comprising means for reading said plurality of signal charge packets.

43. The apparatus according to claim 30, wherein said plurality of spatially separate elementary charge components each have substantially a same first number of elementary charges, the respective known numbers thereby each being substantially equal to said first number.

44. An apparatus for the detection of a spatially localized input signal, comprising:
   a distributor that generates from said spatially localized input signal a plurality of distinct signal components, each signal component having a respective known number of fundamental species independent of the spatially localized input signal magnitude, the number of said plurality of distinct signal components being a known monotonic function of the magnitude of said spatially localized input signal; and
   a multichannel charge amplifier having a plurality of independent amplifier channels that are coupled to said distributor such that the plurality of distinct signal components cause a respective plurality of independent amplifier channels to be stimulated by a respective plurality of elementary charge components, each stimulated independent amplifier channel independently amplifying each of said plurality of elementary charge components to provide a respective plurality of signal charge packets, each signal charge packet having a second number of elementary charges greater than said respective known number by a respective amplification factor.

45. The apparatus according to claim 44, wherein said spatially localized input signal is an optical signal, and said fundamental species is a photon, each of the plurality of distinct signal components thereby being composed of at least one photon, the apparatus further comprising a photoelectric converter that generates the respective plurality of elementary charge components from the plurality of signal components.

46. The apparatus according to claim 45, wherein said distributor includes a fiber optic plate, and said photoelectric converter is provided by a semiconductor layer.

47. The apparatus according to claim 45, wherein each signal component has one photon to within a statistically significant metric.

48. The apparatus according to claim 44, wherein said spatially localized input signal is an optical signal and said fundamental species is a charge species.

49. The apparatus according to claim 48, wherein said elementary charge components that stimulate the independent amplifier channels are said distinct signal components.

50. The apparatus according to claim 48, wherein said elementary charge components that stimulate the independent amplifier channels are provided by said distinct signal components, and wherein said distributor splits said input optical signal into a plurality of photon signal packets, converts the plurality of photon signal packets into a respective plurality of photo-charge signals, and distributes the respective plurality of photo-charge signals to provide said elementary charge components.

51. The apparatus according to claim 48, wherein said spatially localized input signal is an optical signal and said fundamental species is a charge species, wherein said elementary charge components that stimulate the independent amplifier channels are provided by said distinct signal components, wherein said distributor converts said optical signal into an electrical signal, and distributes the electrical signal to provide said elementary charge components.

52. The apparatus according to claim 48, wherein said distributor includes an optical splitter and a charge-coupled splitter.

53. The apparatus according to claim 44, wherein said spatially localized input signal is an electrical signal and said fundamental species is a charge species, wherein said distributor distributes said electrical signal to provide said elementary charge components.

54. The apparatus according to claim 44, wherein the number of fundamental species contained in each distinct signal component is one to within a significantly significant metric.

55. The apparatus according to claim 44, wherein said multichannel amplifier employs avalanche multiplication.

56. The apparatus according to claim 55, wherein the avalanche multiplication includes multi-stage avalanche multiplication.

57. The apparatus according to claim 55, wherein the multichannel amplifier is provided as a semiconductor device.

58. The apparatus according to claim 44, further comprising a readout element coupled to read said plurality of signal charge packets.

59. The apparatus according to claim 58, further comprising a multichannel integrator having a plurality of independent integrator channels respectively coupled to (i) the independent amplifier channels to accumulate said plurality of signal charge packets, and (ii) the readout element.

60. The apparatus according to claim 59, each channel further comprising a multichannel quantifier element coupled to the multichannel integrator and to the multichannel amplifier to gate the operation of the multichannel amplifier in response to the quantity of charge accumulated by the multichannel integrator.

61. The apparatus according to claim 60, wherein said readout element is coupled to sum the plurality of signal charge packets accumulated by said multichannel integrator.

62. The apparatus according to claim 60, further comprising a multichannel governor element coupled to said integrator and operative in eliminating the charge accumulated by said multichannel integrator.

63. The apparatus according to claim 44, wherein said multichannel amplifier is part of a solid state device implemented as an integrated planar structure disposed between two electrodes, the electrodes being provided for connection to a power supply source.

64. The apparatus according to claim 63, wherein said solid state device is implemented as a semiconductor.

65. The apparatus according to claim 64, wherein said multichannel amplifier is implemented in a third layer, and the integrated planar device further comprises between the third layer and a first one of said two electrodes, a fourth layer made of a material forming a first energy barrier for a minority carrier of said third layer to transport into the fourth layer from the direction of said third layer, and forming a second energy barrier for a carrier of conductivity type opposite to said minority carrier to transport into the fourth layer from the direction of said first one of said two electrodes.

66. The apparatus according to claim 65, wherein said multichannel amplifier employs avalanche multiplication.

67. The apparatus according to claim 66, wherein the integrated planar device further comprises a fifth layer of a conducting material disposed between said fourth layer and said third layer, said fifth layer patterned into separate integrating regions respectively corresponding to the channels of said multichannel amplifier.

68. The apparatus according to claim 67, wherein said fourth layer is patterned into separate fourth regions each of which contacts said first electrode and at least one of said integrating electrodes.

69. The apparatus according to claim 68, wherein said integrating electrodes are capacitively coupled in parallel to said first electrode.

70. The apparatus according to claim 69, further comprising a plurality of local conductive regions disposed between said third layer and said fifth layer, at least one of said local conductive regions disposed between each of said integrating regions and said third layer.

71. The apparatus according to claim 70, wherein a plurality of said local conductive regions are disposed between each of said integrating regions and said third layer.

72. The apparatus according to claim 71, wherein each of said integrating regions contacts the plurality of local conductive regions via a respective conductive plug.

73. The apparatus according to claim 72, wherein said integrating regions and said conductive plugs are formed of a common material that provides an energy barrier for majority carriers of said third layer.

74. The apparatus according to claim 70, wherein said plurality of local conductive regions are formed in said third layer as regions having a conductivity type opposite to the conductivity type of said third layer, thereby providing an energy barrier for majority carriers of said third layer.

75. The apparatus according to claim 70, wherein when the quantity of charge accumulated on said integrating region reaches a given quantity, the maximum electric field in said third layer coupled via said conductive region is insufficient to support amplification by avalanche multiplication in said third layer, and the electric field in said third layer is sufficient to initiate discharging of the accumulated charge.

76. The apparatus according to claim 70, further comprising:
a first layer which converts photons provided by said distributor into elementary charge; and
a second layer disposed between said first layer and said third layer and operative in transporting each elementary charge to said third layer.

77. The apparatus according to claim 44, wherein said plurality of spatially separate elementary charge components each have substantially a same first number of elementary charges, the respective known numbers thereby each being substantially equal to said first number.

78. The apparatus according to claim 77, wherein said multichannel amplifier employs avalanche multiplication.

79. The apparatus according to claim 78, wherein said multichannel amplifier includes multi-stage amplification.

80. An apparatus according to claim 44, wherein said spatially localized input signal is an optical signal, said fundamental species is a photon, each of the plurality of distinct signal components thereby being composed of at least one photon, wherein said distributor is an optical splitter having an input optical waveguide for receiving the optical signal and having for each channel a separate output optical waveguide optically coupled to the input optical waveguide, said apparatus further comprising:
- a monolithic semiconductor structure having an upper surface and an opposite lower surface and including a region of first conductivity and a plurality of spatially separate regions of opposite conductivity corresponding to each of the channels and forming separate p-n junctions with the region of first conductivity, the monolithic semiconductor structure being disposed between a first conductive electrode and a second conductive electrode, the first conductive electrode conductively coupled to the region of first conductivity to provide a terminal that is common to each of the p-n junctions;
- a respective conductive integrating electrode for each channel, each conductive integrating electrode conductively coupled to at least one of the spatially separate regions of opposite conductivity such that each channel is associated with at least one p-n junction;
- an insulating layer between the plurality of conductive integrating electrodes and the second conductive electrode, each of the plurality of conductive integrating electrodes thereby being capacitively coupled to the second conductive electrode;
- a plurality of conductive plugs, each conductive plug contacting said second conductive electrode and a respective one of said conductive integrating electrodes, the conductive plugs being made of a material that provides a first energy barrier for a carrier of said opposite conductivity to transport into the conductive plug from the spatially separate regions, and forms a second energy barrier for a carrier of said first conductivity type opposite to transport into the conductive plug from said second electrode; and
- wherein said optical splitter is disposed such that that signal components output by said output waveguides are incident on the upper surface and absorbed in spatially separate portions of the monolithic semiconductor structure to provide the respective plurality of elementary charge components from the plurality of signal components.

81. The apparatus according to claim 80, further comprising an antireflective material layer disposed between and in contact with the output waveguides of said optical splitter and the upper surface.

82. The apparatus according to claim 81, wherein said upper surface includes a recessed region and said optical splitter is inserted into said recessed region.

83. The apparatus according to claim 82, wherein said first electrode is formed on a portion of the upper surface that is not within the recessed region.

84. The apparatus according to claim 83, wherein said semiconductor is silicon and said first conductivity is p-type.

85. The apparatus according to claim 84, wherein said contact plug material is silicon carbide.

86. The apparatus according to claim 80, wherein in operation the respective plurality of elementary charge components are amplified by avalanche multiplication in local semiconductor regions of the first conductivity near the p-n junctions as the elementary charge components are transported to the spatially separate regions of opposite conductivity.

87. An apparatus according to claim 44, wherein said spatially localized input signal is an optical signal, said fundamental species is a photon, each of the plurality of distinct signal components thereby being composed of at least one photon, wherein said distributor is an optical splitter having an input optical waveguide for receiving the optical signal and having for each channel a separate output optical waveguide optically coupled to the input optical waveguide, said apparatus further comprising:
- a semiconductor layer having an upper surface and a laterally defined region of a first conductivity type, and having a plurality of spatially separate regions of opposite conductivity corresponding to each of the channels and forming separate p-n junctions with the region of first conductivity,
- an insulating layer disposed on said upper surface;
- a linear array of conductive storage electrodes disposed on said insulator, each storage electrode corresponding to a respective one of the separate output optical waveguides, each storage electrode operative in forming a potential well in an underlying portion of the semiconductor region;
- a linear array of conductive splitting electrodes disposed on said insulator, each splitting electrode spaced away laterally from a respective one of the storage electrodes and operative in controlling the electrostatic potential in an underlying portion of the semiconductor region to provide for charge-coupled transfer of charge from a potential well formed under the corresponding respective storage electrode;
- a linear array of conductive integrating electrodes disposed over said upper surface, each of the conductive integrating electrodes conductively coupled to at least one of the spatially separate regions of opposite conductivity such that each conductive integrating electrode is associated with at least one p-n junction, each of the splitting electrodes corresponding to and spaced away laterally from a plurality of the conductive integrating electrodes to provide for transport and splitting of charge from a semiconductor region underlying the splitting electrode to semiconductor regions underlying the corresponding conductive integrating electrodes;
- a plurality of conductive plugs, each conductive plug contacting a respective one of said conductive integrating electrodes and a readout conductive electrode that is disposed on said insulator, the conductive plugs being made of a material that provides a first energy barrier for a carrier of said opposite conductivity to transport into the conductive plug from the spatially separate regions, and forms a second energy barrier for a carrier of said first conductivity type opposite to transport into the conductive plug from the readout conductive electrode; and
- wherein said optical splitter is disposed such that that signal components output by said output waveguides are incident on and absorbed in respective portions of the semiconductor layer underlying respective said storage electrodes to provide the respective plurality of elementary charge components from the plurality of signal components.

88. The apparatus according to claim 87, wherein each of said conductive plugs contact the same said readout conductive electrode.

89. The apparatus according to claim 87, wherein said semiconductor is silicon and said first conductivity is p-type.

90. The apparatus according to claim 89, wherein said contact plug material is silicon carbide.

91. The apparatus according to claim 87, wherein in operation the respective plurality of elementary charge components are amplified by avalanche multiplication in local semiconductor regions of the first conductivity near the p-n junctions as the elementary charge components are transported to the spatially separate regions of opposite conductivity.

92. An apparatus according to claim 44, wherein said spatially localized input signal is an optical signal, said fundamental species is an electron or hole, each of the plurality of distinct signal components thereby being composed of at least one electron or hole, said apparatus further comprising:

a semiconductor layer having an upper surface and a laterally defined region of a first conductivity type, and having a plurality of spatially separate regions of opposite conductivity corresponding to each of the channels and forming separate p-n junctions with the region of first conductivity, an insulating layer disposed on said upper surface;

a conductive storage electrode disposed on said insulator, the storage electrode operative in forming a potential well in an underlying portion of the semiconductor region;

a conductive splitting electrode disposed on said insulator, the splitting electrode spaced away laterally from the storage electrode and operative in controlling the electrostatic potential in an underlying portion of the semiconductor region to provide for charge-coupled transfer of charge from a potential well formed under the storage electrode;

a linear array of conductive integrating electrodes disposed over said upper surface, each of the conductive integrating electrodes in the linear array corresponding to a respective channel, each of the conductive integrating electrodes conductively coupled to at least one of the spatially separate regions of opposite conductivity such that each conductive integrating electrode is associated with at least one p-n junction, each of the conductive integrating electrodes spaced laterally from the splitting electrode to provide for transport and splitting of charge from the semiconductor region underlying the splitting electrode to semiconductor regions underlying the conductive integrating electrodes to provide the respective plurality of elementary charge components;

a plurality of conductive plugs, each conductive plug contacting a respective one of said conductive integrating electrodes and a readout electrode disposed on said insulator, the conductive plugs being made of a material that provides a first energy barrier for a carrier of said opposite conductivity to transport into the conductive plug from the spatially separate regions, and forms a second energy barrier for a carrier of said first conductivity type opposite to transport into the conductive plug from the readout electrode; and wherein the input optical signal is incident on and absorbed in a portion of the semiconductor layer underlying the storage electrode to generate charge having a magnitude substantially proportional to the absorbed input optical signal.

93. The apparatus according to claim 92, wherein each of said conductive plugs contact the same said readout conductive electrode.

94. The apparatus according to claim 92, wherein said semiconductor is silicon and said first conductivity is p-type.

95. The apparatus according to claim 94, wherein said contact plug material is silicon carbide.

96. The apparatus according to claim 92, wherein in operation the respective plurality of elementary charge components are amplified by avalanche multiplication in local semiconductor regions of the first conductivity near the p-n junctions as the elementary charge components are transported to the spatially separate regions of opposite conductivity.

97. A method providing for measuring the magnitude of a spatially localized input signal, the method comprising:

splitting a signal representative of the magnitude of the spatially localized input signal to provide a number of spatially separate elementary charge components, each elementary charge component having a respective number of elementary charges independent of said magnitude and known to within a statistical metric prior to splitting the signal, the number of said plurality of spatially separate elementary charge components being a known monotonic function of the magnitude of said spatially localized input signal; and independently amplifying each of said plurality of spatially divided elementary charge components according to a self-limited gain mechanism to provide a corresponding signal charge packet for each of said plurality of spatially divided elementary charge components, each signal charge packet having a second number of elementary charges greater than said respective number of elementary charges by a respective amplification factor.

98. The method according to claim 97, wherein said spatially localized input signal and said signal representative of said spatially localized input signal are the same signal, said spatially localized input signal thereby being split to provide the number of spatially separate elementary charge components.

99. The method according to claim 98, wherein said spatially localized input signal is an optical signal that is split into a plurality of optical signal components that are respectively photoconverted into said spatially separate elementary charge components.

100. The method according to claim 98, wherein said spatially localized input signal is an electrical signal that is split into said spatially separate elementary charger components.

101. The method according to claim 97, wherein said spatially localized input signal is an optical signal, the signal representative of the magnitude of the input signal is an electrical signal generated by photoconversion of the optical signal, the spatially separate charge components being provided by splitting the electrical signal generated by photoconversion.

102. The method according to claim 97, wherein said spatially localized input signal is a spatially localized portion of a one-dimensional or two-dimensional input signal.

103. The method according to claim 97, wherein said respective number of elementary charges for each said elementary charge component is independent of the spatial location of said spatially localized input signal.

104. The method according to claim 97, wherein said respective number of elementary charges for each said elementary charge component is the same value to within a statistically significant metric.

105. The method according to claim 104, wherein said same value equals one to within a statistically significant metric.

106. A method providing for the detection of an input signal, comprising:
- generating from said input signal a plurality of spatially separate elementary charge components, each having a respective known number of elementary charges, the number of said plurality of spatially separate elementary charge components being a known monotonic function of the magnitude of said input signal; and
- independently amplifying each of said plurality of spatially divided elementary charge components to provide a respective plurality of signal charge packets, each signal charge packet having a second number of elementary charges greater than said respective known number by a respective amplification factor;
- wherein the independent amplification of said plurality of spatially divided elementary charge components provides each of said plurality of signal charge packets with substantially the same said second number of elementary charges.

107. A method providing for the detection of an input signal, comprising:
- generating from said input signal a plurality of spatially separate elementary charge components, each having a respective known number of elementary charges, the number of said plurality of spatially separate elementary charge components being a known monotonic function of the magnitude of said input signal; and
- independently amplifying each of said plurality of spatially divided elementary charge components to provide a respective plurality of signal charge packets, each signal charge packet having a second number of elementary charges greater than said respective known number by a respective amplification factor,
- wherein said plurality of spatially separate elementary charge components each have substantially a same first number of elementary charges, the respective known numbers thereby each being substantially equal to said first number.

108. A method providing for the detection of an input signal, comprising:
- generating from said input signal a plurality of spatially separate elementary charge components, each having a respective known number of elementary charges, the number of said plurality of spatially separate elementary charge components being a known monotonic function of the magnitude of said input signal; and
- independently amplifying each of said plurality of spatially divided elementary charge components to provide a respective plurality of signal charge packets, each signal charge packet having a second number of elementary charges greater than said respective known number by a respective amplification factor,
- wherein said input signal is an optical signal, and said spatially separate elementary charge components are provided by splitting said optical signal into a plurality of photon signal packets.

109. A method providing for the detection of an input signal, comprising:
- generating from said input signal a plurality of spatially separate elementary charge components, each having a respective known number of elementary charges, the number of said plurality of spatially separate elementary charge components being a known monotonic function of the magnitude of said input signal; and
- independently amplifying each of said plurality of spatially divided elementary charge components to provide a respective plurality of signal charge packets, each signal charge packet having a second number of elementary charges greater than said respective known number by a respective amplification factor;
- wherein said input signal is an electrical signal, and said spatially divided elementary charge components are provided by splitting said electrical signal into each of said spatially divided elementary charge components, wherein each spatially divided elementary charge component has one elementary charge to within a statistically significant metric.

110. A method providing for the detection of an input signal, comprising:
- generating from said input signal a plurality of spatially separate elementary charge components, each having a respective known number of elementary charges, the number of said plurality of spatially separate elementary charge components being a known monotonic function of the magnitude of said input signal;
- independently amplifying each of said plurality of spatially divided elementary charge components to provide a respective plurality of signal charge packets, each signal charge packet having a second number of elementary charges greater than said respective known number by a respective amplification factor; and
- generating an output signal representing the sum of all of said plurality of signal charge packets.

111. A method providing for the detection of an input signal, comprising:
- generating from said input signal a plurality of spatially separate elementary charge components, each having a respective known number of elementary charges, the number of said plurality of spatially separate elementary charge components being a known monotonic function of the magnitude of said input signal;
- independently amplifying each of said plurality of spatially divided elementary charge components to provide a respective plurality of signal charge packets, each signal charge packet having a second number of elementary charges greater than said respective known number by a respective amplification factor; and
- reading out each of said plurality of signal charge packets individually.

112. A method providing for the detection of an input signal, comprising:
- generating from said input signal a plurality of spatially separate elementary charge components, each having a respective known number of elementary charges, the number of said plurality of spatially separate elementary charge components being a known monotonic function of the magnitude of said input signal; and
- independently amplifying each of said plurality of spatially divided elementary charge components to provide a respective plurality of signal charge packets, each signal charge packet having a second number of elementary charges greater than said respective known number by a respective amplification factor;

wherein each of said plurality of signal charge packets is provided by a dosed charge accumulation mechanism that results in each of said plurality of signal charge packets having a given quantity of charge.

113. An apparatus providing for the detection of an input signal, comprising:

means for generating from said input signal a plurality of spatially separate elementary charge components, each having a respective known number of elementary charges, the number of said plurality of spatially separate elementary charge components being a known monotonic function of the magnitude of said input signal; and means for independently amplifying each of said plurality of spatially divided elementary charge components to provide a respective plurality of signal charge packets, each signal charge packet having a second number of elementary charges greater than the known respective number by a respective amplification factor;

wherein the independent amplification of said plurality of spatially divided elementary charge components provides each of said plurality of signal charge packets with substantially the same said second number of elementary charges.

114. An apparatus providing for the detection of an input signal, comprising:

means for generating from said input signal a plurality of spatially separate elementary charge components, each having a respective known number of elementary charges, the number of said plurality of spatially separate elementary charge components being a known monotonic function of the magnitude of said input signal; and means for independently amplifying each of said plurality of spatially divided elementary charge components to provide a respective plurality of signal charge packets, each signal charge packet having a second number of elementary charges greater than the known respective number by a respective amplification factor;

wherein said generating means includes a charge coupled splitter.

115. An apparatus providing for the detection of an input signal, comprising:

means for generating from said input signal a plurality of spatially separate elementary charge components, each having a respective known number of elementary charges, the number of said plurality of spatially separate elementary charge components being a known monotonic function of the magnitude of said input signal;

means for independently amplifying each of said plurality of spatially divided elementary charge components to provide a respective plurality of signal charge packets, each signal charge packet having a second number of elementary charges greater than the known respective number by a respective amplification factor;

means for accumulating each of said plurality of signal charge packets; and means for dosed charge accumulation such that each of said plurality of signal charge packets has a given quantity of charge.

116. An apparatus providing for the detection of an input signal, comprising:

means for generating from said input signal a plurality of spatially separate elementary charge components, each having a respective known number of elementary charges, the number of said plurality of spatially separate elementary charge components being a known monotonic function of the magnitude of said input signal; and means for independently amplifying each of said plurality of spatially divided elementary charge components to provide a respective plurality of signal charge packets, each signal charge packet having a second number of elementary charges greater than the known respective number by a respective amplification factor;

wherein said plurality of spatially separate elementary charge components each have substantially a same first number of elementary charges, the respective known numbers thereby each being substantially equal to said first number.

117. An apparatus for the detection of an input signal, comprising:

a distributor that generates from said input signal a plurality of distinct signal components, each signal component having a respective known number of fundamental species independent of the input signal magnitude, the number of said plurality of distinct signal components being a known monotonic function of the magnitude of said input signal; and a multichannel charge amplifier having a plurality of independent amplifier channels that are coupled to said distributor such that the plurality of distinct signal components cause a respective plurality of independent amplifier channels to be stimulated by a respective plurality of elementary charge components, each stimulated independent amplifier channel independently amplifying each of said plurality of elementary charge components to provide a respective plurality of signal charge packets, each signal charge packet having a second number of elementary charges greater than said respective known number by a respective amplification factor;

wherein said input signal is an optical signal, and said fundamental species is a photon, each of the plurality of distinct signal components thereby being composed of at least one photon, the apparatus further comprising a photoelectric converter that generates the respective plurality of elementary charge components from the plurality of signal components.

118. An apparatus for the detection of an input signal, comprising:

a distributor that generates from said input signal a plurality of distinct signal components, each signal component having a respective known number of fundamental species independent of the input signal magnitude, the number of said plurality of distinct signal components being a known monotonic function of the magnitude of said input signal; and a multichannel charge amplifier having a plurality of independent amplifier channels that are coupled to said distributor such that the plurality of distinct signal components cause a respective plurality of independent amplifier channels to be stimulated by a respective plurality of elementary charge components, each stimulated independent amplifier channel independently amplifying each of said plurality of elementary charge components to provide a respective plurality of signal charge packets, each signal charge packet having a second number of elementary charges greater than said respective known number by a respective amplification factor;

wherein the number of fundamental species contained in each distinct signal component is one to within a significantly significant metric.

119. An apparatus for the detection of an input signal, comprising:

a distributor that generates from said input signal a plurality of distinct signal components, each signal component having a respective known number of fundamental species independent of the input signal magnitude, the number of said plurality of distinct signal components being a known monotonic function of the magnitude of said input signal;

a multichannel charge amplifier having a plurality of independent amplifier channels that are coupled to said distributor such that the plurality of distinct signal components cause a respective plurality of independent amplifier channels to be stimulated by a respective plurality of elementary charge components, each stimulated independent amplifier channel independently amplifying each of said plurality of elementary charge components to provide a respective plurality of signal charge packets, each signal charge packet having a second number of elementary charges greater than said respective known number by a respective amplification factor;

a readout element coupled to read said plurality of signal charge packets; and a multichannel integrator having a plurality of independent integrator channels respectively coupled to (i) the independent amplifier channels to accumulate said plurality of signal charge packets, and (ii) the readout element.

* * * * *